United States Patent
Kitagawa et al.

(10) Patent No.: US 9,590,606 B2
(45) Date of Patent: Mar. 7, 2017

(54) SEMICONDUCTOR DEVICE HAVING DUTY CORRECTION CIRCUIT

(71) Applicant: MICRON TECHNOLOGY, INC., Boise, ID (US)

(72) Inventors: Katsuhiro Kitagawa, Tokyo (JP); Hiroki Takahashi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/318,067

(22) Filed: Jun. 27, 2014

(65) Prior Publication Data

US 2015/0002201 A1   Jan. 1, 2015

(30) Foreign Application Priority Data

Jun. 27, 2013  (JP) .................................. 2013-134497

(51) Int. Cl.
*H03K 5/156* (2006.01)

(52) U.S. Cl.
CPC .................................. *H03K 5/1565* (2013.01)

(58) Field of Classification Search
USPC ......................................................... 327/175
See application file for complete search history.

(56) References Cited

U.S. PATENT DOCUMENTS

| | | | | |
|---|---|---|---|---|
| 7,990,194 B2* | 8/2011 | Shim | ........................ | G11C 7/22 327/149 |
| 8,461,889 B2* | 6/2013 | Willey | ................. | H03K 5/1565 327/149 |
| 2006/0091921 A1* | 5/2006 | Park et al. | ..................... | 327/175 |
| 2011/0204948 A1* | 8/2011 | Satoh | ................... | H03K 5/1565 327/175 |
| 2014/0002156 A1* | 1/2014 | Dwivedi et al. | .............. | 327/175 |
| 2014/0002157 A1* | 1/2014 | Choi et al. | ..................... | 327/175 |
| 2014/0125390 A1* | 5/2014 | Ma | ................................ | 327/175 |
| 2014/0125391 A1* | 5/2014 | Seon | ............................. | 327/175 |

FOREIGN PATENT DOCUMENTS

JP   2008-210436   9/2008

\* cited by examiner

*Primary Examiner* — Ryan Jager
(74) *Attorney, Agent, or Firm* — Dorsey & Whitney LLP

(57) ABSTRACT

Disclosed herein is a device includes a duty correction circuit adjusting a duty ratio of a first clock signal based on a duty control signal to generate a second clock signal; a delay line delaying the second clock signal to generate a third clock signal; and a duty cycle detector detecting the duty ratio of the second clock signal to generate the duty control signal in a first mode, and detecting the duty ratio of the third clock signal to generate the duty control signal in a second mode.

17 Claims, 21 Drawing Sheets

SEMICONDUCTOR DEVICE HAVING DUTY CORRECTION CIRCUIT

BACKGROUND

Field of the Invention

The present invention relates to a semiconductor device, and particularly to a semiconductor device that includes a duty correction circuit for adjusting a duty ratio of a clock signal, Description of Related Art The type called DDR (Double Data Rate) is the mainstream of DRAM (Dynamic Random Access Memory), which is a typical semiconductor memory device. The DDR-type DRAM is designed to input or output data in synchronization with both rising and falling edges of the clock signal. Therefore, the duty ratio of the clock signal needs to be precisely kept at 50%. For that purpose, a duty correction circuit is frequently used (See Japanese Patent Application Laid-Open No. 2008-210436).

The duty correction circuit is usually incorporated into a DLL (Delay Locked Loop) circuit that controls the phase of the clock signal. The DLL circuit includes a delay line that delays the clock signal. The duty ratio of the clock signal that has passed through the delay line is detected by a duty cycle detector, and the results thereof are fed back to the duty correction circuit, which then adjust the duty ratio of the clock signal.

However, the delay line has a relatively large amount of inherent delay. Therefore, the loop length of a feedback loop consisting of the duty correction circuit and the duty cycle-detector is relatively long. This leads to a decrease in feedback responsiveness in duty-control. The problem is that it takes a long time to reach a desired duty ratio.

SUMMARY

In one embodiment, there is provided a semiconductor device that includes a duty correction circuit adjusting a duty ratio of a first clock signal based on a duty control signal to generate a second clock signal; a delay line delaying the second clock signal to generate a third clock signal; and a duty cycle detector detecting the duty ratio of the second clock signal to generate the duty control signal in a first mode, and detecting the duty ratio of the third clock signal to generate the duty control signal in a second mode.

In another embodiment, there is provided a semiconductor device that includes a duty correction circuit inserted into a propagation path of a clock signal and adjusting a duty ratio of the clock signal based on a duty control signal; and a duty cycle detector detecting a duty ratio of the clock signal output from the duty correction circuit to generate the duty control signal. In a first mode, the duty cycle detector detects the duty ratio of the clock signal that emerges on a first node of the propagation path so that a feedback loop containing the duty correction circuit and the duty cycle detector has a first loop length. In second mode, the duty cycle detector detects the duty ratio of the clock signal that emerges on a second node of the propagation path that is different from the first node so that the feedback loop has a second loop length that is longer than the first loop length.

In still another embodiment, there is provided a semiconductor device that includes a duty correction circuit adjusting a duty ratio of a first clock signal based on a duty control signal to generate a second clock signal; a delay line delaying the second clock signal to generate a third clock signal; and a duty detection unit receiving the second clock signal and the third clock signal.

According to the present invention, the configurations of the feedback loop can be switched depending on the mode. Therefore, the feedback responsiveness in duty-control can be increased.

DETAILED DESCRIPTION OF THE EMBODIMENTS

Preferred embodiments of the present invention will be explained below in detail with reference to the accompanying drawings.

Figure 1:
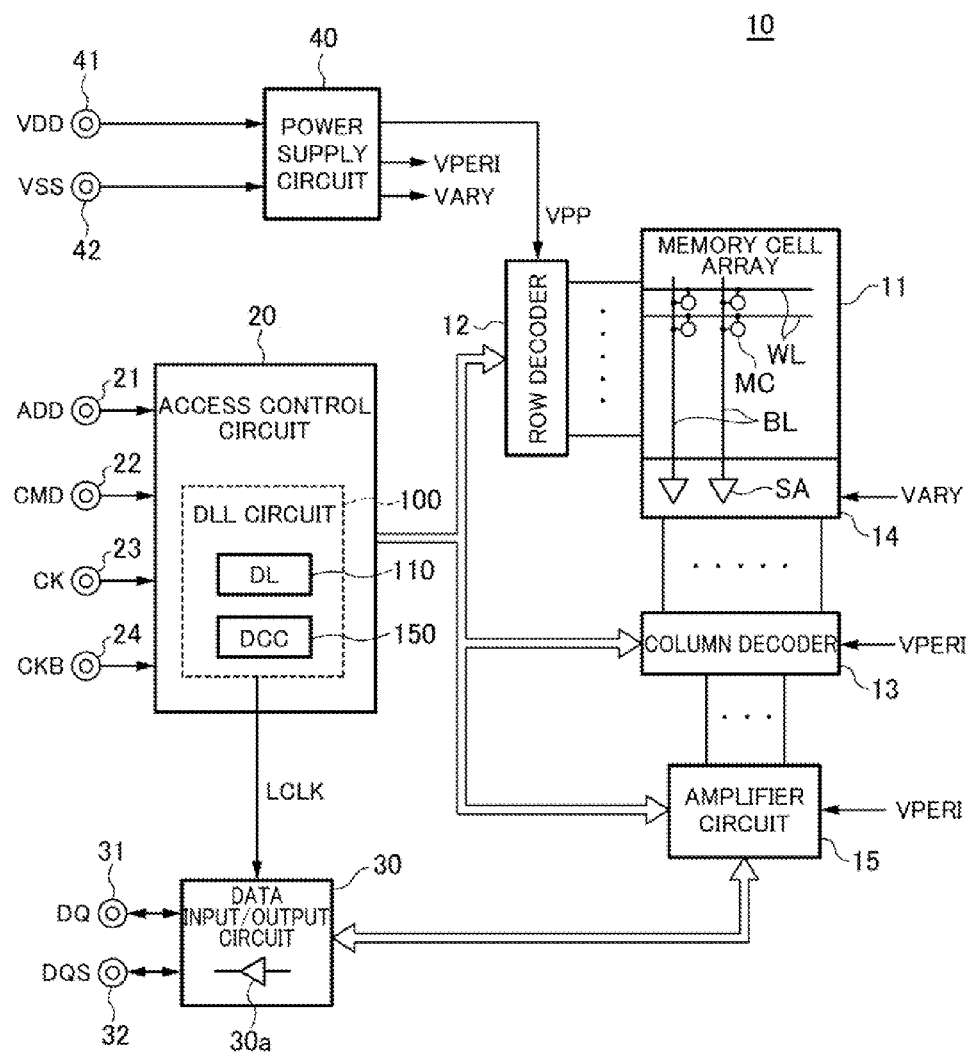
FIG. 1 is a block diagram indicative of an embodiment of a general configuration of a semiconductor device according to a preferred embodiment of the present invention.

Referring now to FIG. 1, the semiconductor device 10 according to the preferred embodiment of the present invention is a DRAM and includes the memory cell array 11. In the memory cell array 11, a plurality of word lines WL and a plurality of bit lines BL intersecting with each other are provided and a plurality of memory cells MC are arranged at intersections thereof, respectively. Selection of a word line WL is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to the amplifier circuit 15 through the corresponding sense amplifier SA.

Operations of the row decoder 12, the column decoder 13, the sense circuit 14, and the amplifier circuit 15 are controlled by an access control circuit 20. An address signal ADD, a command signal CMD, external clock signals CK and CKB, a clock enable signal CKE, and the like are supplied to the access control circuit 20 through external terminals 21 to 24. The external clock signals CK and CKB are signals complementary to each other. The access control circuit 20 controls the row decoder 12, the column decoder 13, the sense circuit 14, the amplifier circuit 15, and a data input/output circuit 30 based on these signals.

Specifically, when the command signal CMD indicates the active command, the address signal ADD is supplied to the row decoder 12. In response thereto, the row decoder 12 selects a word line WL indicated by the address signal ADD and accordingly corresponding memory cells MC are connected to the corresponding bit lines BL, respectively. The access control circuit 20 then activates the sense circuit 14 in a predetermined timing.

On the other hand, when the command signal CMD indicates the read command or the write command, the address signal ADD is supplied to the column decoder 13. In response thereto, the column decoder 13 connects a bit line BL indicated by the address signal ADD to the amplifier circuit 15. Accordingly, at the time of a read operation, read data DQ that are read from the memory cell array 11 through the corresponding sense amplifier SA are output to outside from the data terminal 31 through the amplifier circuit 15 and the data input/output circuit 30. At the time of a write operation, write data DQ that are supplied from outside through the data terminal 31 and the data input/output circuit 30 are written into the corresponding memory cells MC through the amplifier circuit 15 and the sense amplifier SA.

The access control circuit 20 includes a DLL circuit 100. The DLL circuit 100 generates an internal clock signal LCLK that is phase-control led based on the external clock signals CK and CKB. The DLL circuit 100 includes a delay line (DL) 110 that delays the internal clock signal LCLK and a duty correction circuit (Dcc) 150 that adjusts a duty ratio to 50%. The details of the DLL circuit 100 will be described later. The internal clock signal LCLK is supplied to an output circuit 30a included in the data input/output circuit 30. The read data DQ and a data strobe signal DQS are respectively output from the data terminal 31 and a data strobe terminal 32 in synchronism with the internal clock signal LCLK.

Each of the foregoing circuit blocks uses a predetermined internal voltage as its operating power supply. Such internal power supplies are generated by a power supply circuit 40. The power supply circuit 40 receives an external potential VDD and a ground potential VSS that are supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is mainly used in the row decoder 12. The row decoder 12 drives a word line WL selected based on the address signal ADD to the VPP level, thereby making the cell transistors included in the memory cells MC conductive. The internal voltage VARY is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. Using the internal voltage VPERI lower than the external voltage VDD as the operating voltage of the peripheral circuits reduces power consumption of the semiconductor device 10.

Figure 2:
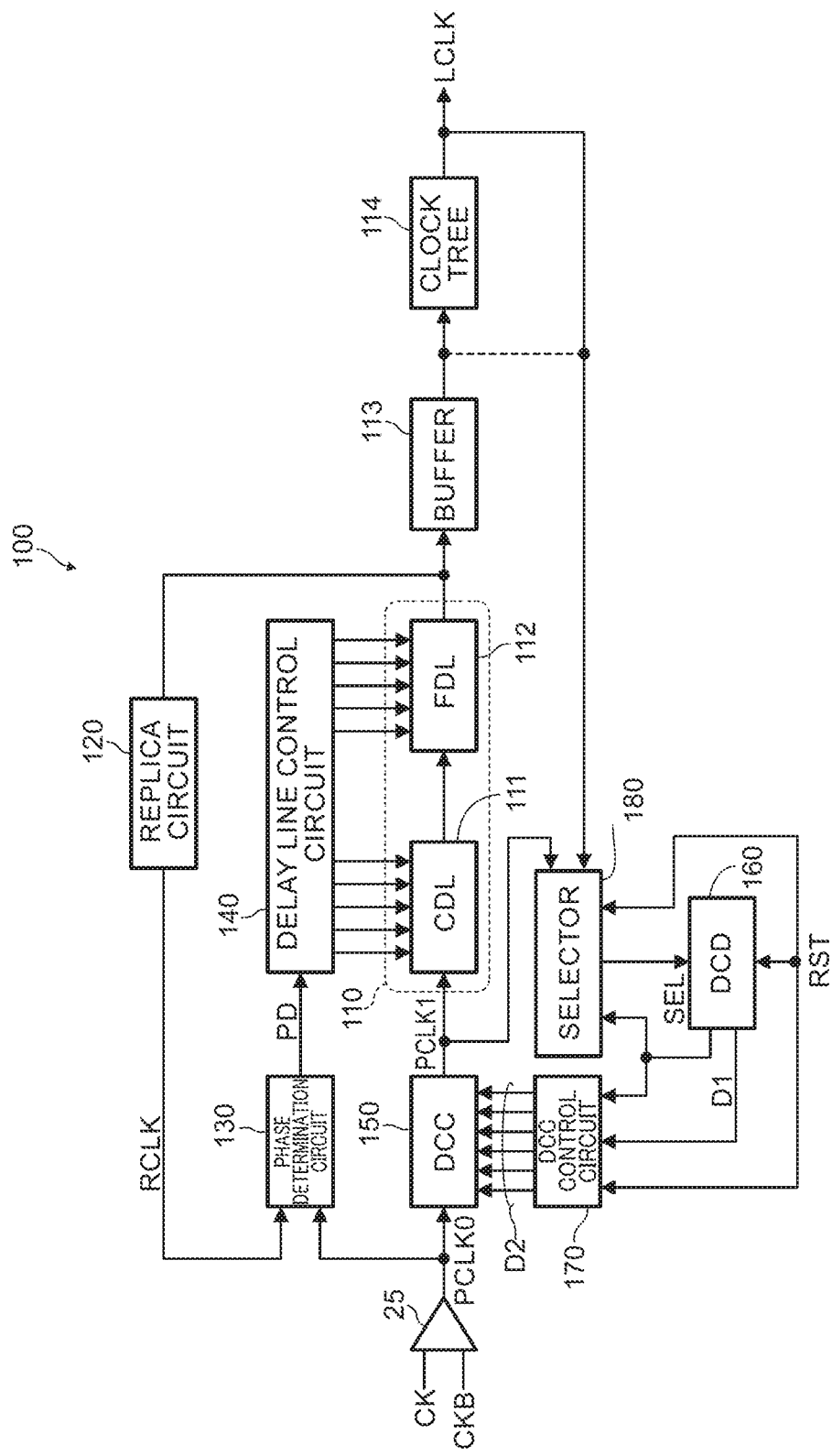
FIG. 2 is a block diagram indicative of an embodiment of a configuration of the DLL circuit shown in FIG. 1.

Turning to FIG. 2, the DLL circuit 100 includes a delay line 110 that, generates an internal clock signal LCLK by delaying an internal clock signal PCLK1. The internal clock signal PCLK1 is a signal which an internal clock signal PCLK0 output from a clock receiver 25 which, receives the external clock signals CK and CKB passed through coarse the duty correction circuit 150. The delay line 110 has a constitution in which a coarse delay line (CDL) 111 having a coarse adjustment pitch of delay amount and a fine delay line (FDL) 112 having a fine adjustment pitch of delay amount are connected in series. The internal clock signal LCLK output from the delay line 110 is supplied to the output circuit 30a via a buffer 113 and a clock tree 114 and as described above, used as a timing, signal for defining an output timing of the read data DQ or the data strobe signal DQS.

The internal clock signal LCLK is supplied to a replica circuit 120. The replica circuit 120 is a circuit having substantially the same delay time as that of a circuit group which consists of the buffer 113, the clock tree 114, and the output circuit 30a, and receives the internal clock signal LCLK to output a replica clock signal RCLK. Because the output circuit 30a outputs the read data DQ and the data strobe signal DQS in synchronization with the internal clock signal LCLK, the replica clock signal RCLK output from the replica circuit 120 is accurately synchronized with the read data DQ and the data strobe signal DQS. In the DRAM, the read data DQ and the data strobe signal DQS needs to be accurately synchronized with the external clock signals CK and CKB, and when there is a phase shift between the read data DQ and the data strobe signal DQS and the external clock signals CK and CKB, the phase shift needs to be detected and corrected. The detection of the phase shift is performed by the phase determination circuit 130, and a result of the determination is output as a phase determination signal PD.

The phase determination signal PD is supplied to a delay line control circuit 140. The delay line control circuit 140 is a circuit that counts up or down a count value CNT based on the phase determination signal PD to control an amount of delay of the delay line 110. More specifically, if the phase determination signal PD indicates that the phase of the replica clock signal RCLK is behind the phase of the internal clock signal PCLK0, the delay line control circuit 140 counts down the count value CNT to decrease the amount of delay of the delay line 110. If the phase determination signal PD indicates that the phase of the replica clock signal RCLK is ahead of the phase of the internal clock signal PCLK0, the delay line control circuit 140 counts up the count value CNT to increase the amount of delay of the delay line 110. The amount of delay of the delay line 110 is adjusted through such an operation, so that the replica clock signal RCLK and the internal clock signal PCLK0 are in phase with each other. When the replica clock signal RCLK and the internal clock signal PCLK0 are in phase with each other, the read data DQ and the data strobe signal DQS are synchronized exactly with the external clock signals CK and CKB.

As shown in FIG. 2, the DLL circuit 100 includes the duty correction circuit ISO that adjusts a duty ratio. In the present embodiment, the duty correction circuit 150 is inserted before the delay line 110. The duty correction circuit 150 adjusts the duty ratio of the internal clock signal PCLK0 output from the clock receiver 25 to generate the internal clock signal PCLK1.

According to the present embodiment, a selector 180 selects the internal clock signal PCLKL1 or LCLK. The duty ratio of the selected, internal clock signal PCLK1 or LCLK is detected by a duty cycle detector (DCD) 160, which, thereby generates a duty detection signal D1. A position where the internal clock signal LCLK is detected by the duty cycle detector 160 is preferably placed closer to the output circuit 30a. According to the present, embodiment, the duty ratio of the internal clock signal LCLK that has passed through the clock tree 114 is detected. However, the present invention is not limited to that configuration. As indicated by broken line in FIG. 2, the duty ratio of the internal clock signal LCLK may be detected before the internal clock signal LCLK passes through the clock tree 114.

The selection by the selector 180 is based on a reset signal RST and a switch signal SEL. Although the details will be described later, the internal clock signal PCLK1 is selected when the reset signal RST is activated. Then, the internal clock signal LCLK is selected when the switch, signal SEL is activated. The state where the internal clock signal PCLK1 is selected is referred to as "first mode"; the state where the internal clock signal LCLK is selected is referred to as "second mode". The reset signal RST is a signal that is activated in such cases as when the DLL circuit 100 is initialised. The reset signal RST is generated inside the access control circuit 20 shown in FIG. 1. The switch signal SSL is activated by the duty cycle detector 160 when the duty ratio exceeds a predetermined value. More specifically, when the duty ratio is changed from less than 50% to more than 50%, or when the duty ratio is changed from more than 50% to less than 50%, the switch signal SEL is activated.

The reset signal RST is also supplied to the duty cycle detector 160. Although the details will be described later, the duty cycle detector ISO updates the duty detection signal D1 in a first cycle when the first mode is selected in response to activation of the reset signal RST. After that, when the second mode starts in response to activation of the switch signal SEL, the duty cycle detector 160 updates the duty detection signal D1 in a second cycle, which is longer than the first cycle.

The duty detection signal D1 detected by the duty cycle detector 160 is supplied to a DCC control circuit 170. The DCC control circuit 170 receives the duty detection signal D1, and generates a duty control signal D2 based on the duty detection signal D1, and supplies the duty control signal D2 to the duty correction circuit 150. The duty correction circuit 150 adjusts the duty ratio of the internal clock signal PCLK0 based on the duty control signal D2, and then outputs this signal as the internal clock signal PCLK1.

Figure 3:
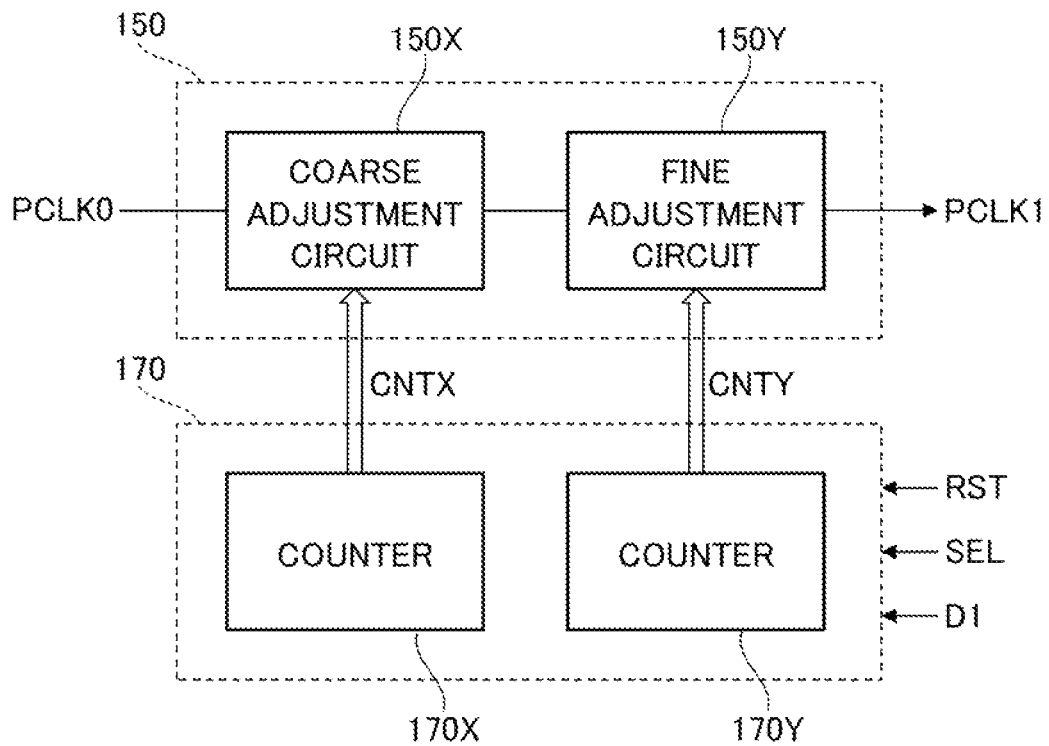
FIG. 3 is a block diagram indicative of an embodiment of a configuration of a duty correction circuit and a DCC control circuit shown in FIG. 2.

Turning to FIG. 3, the duty correction circuit ISO has a structure in which a coarse adjustment circuit 150X and a fine adjustment circuit 150Y are connected in series. The coarse adjustment circuit 150X is a circuit that adjusts the duty ratio of the internal clock signal PCLK0 with a relatively coarse pitch. The coarse adjustment circuit 150X is controlled by a count value CMTX of a counter 170X that is included in the DCC control circuit 170. The fine adjustment circuit 150Y is a circuit that adjusts the duty ratio of the internal clock signal PCLR0 with a relatively fine pitch. The fine adjustment circuit 150Y is controlled by a count value CNTY of a counter 170Y that is included in the DCC control circuit 170.

When the first mode is selected in response to activation of the reset signal RST, the DCC control circuit 170 updates the count value CNTX of the counter 170X based on the duty detection signal D1. Therefore, in the first mode, the coarse adjustment circuit 150X is used in adjusting the duty ratio. Then, when the second mode starts in response to activation of the switch signal SHL, the DCC control circuit 170 updates the count value CNTY of the counter 170Y based on the duty detection signal D1. Therefore, in the second mode, the fine adjustment circuit 150Y is used in adjusting the duty ratio.

Incidentally, more detailed configuration of the duty correction circuit 150 is disclosed in US Patent Application Publication No. 2013/0207701 A1, the entire contents of which are incorporated herein by reference.

Figure 4:
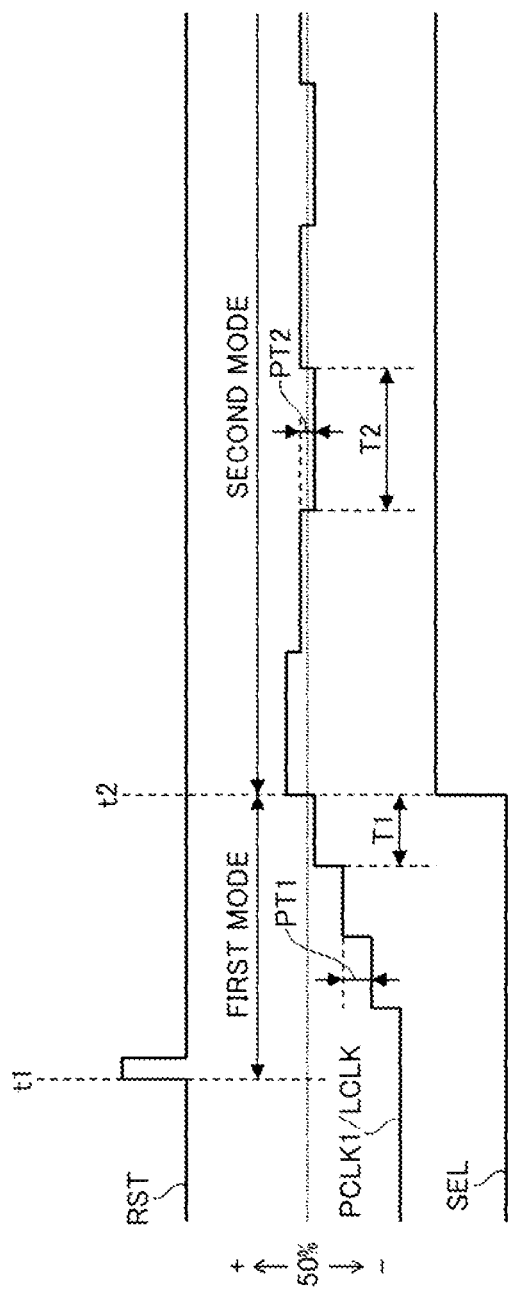
FIG. 4 is a timing chart indicative of an embodiment of a duty adjustment operation by the DLL circuit shown in FIG. 1.

Turning to FIG. 4, at time t1, the reset signal RST is activated; the first mode therefore is selected. In the example shown in FIG. 4, at time t1, the duty ratio of the internal clock signal PCLK1 is less than 50%. Accordingly, the duty correction circuit 150 performs control so as to increase the duty ratio. In the first mode, the duty ratio is adjusted by the duty correction circuit 150 in each first cycle T1. The first cycle T1 is equal to a 16-clock cycle (16 tCK), for example.

In that manner, the duty ratio of the internal clock signal PCLK1 is increased, in each first cycle T1, and the value thereof gradually approaches 50%. In the first mode, the coarse adjustment circuit 150X shown in FIG. 3 is used for duty adjustment. Therefore, the duty adjustment amount in each first cycle T1 is PT1. At time t2, when the duty ratio of the internal clock signal PCLK1 exceeds 50%, the switch signal SEL is activated, and the DLL circuit 100 shifts to the second mode.

After the DLL circuit 100 shifts to the second mode, the selector 180 selects the internal clock signal LCLK. Therefore, the duty cycle detector 160 detects the duty ratio of the internal clock signal LCLK instead of the internal clock signal PCLK1. In the second mode, the duty correction circuit 150 adjusts the duty ratio in each second cycle T2 (>T1). The second cycle T2 is a 32-clock cycle (32 tCK), for example. The reason the cycle T2 in the second mode is set longer than the cycle T1 in the first mode is that the loop length of a feedback loop (150→110→113→114→180→160→170→150) in the second mode is longer than the loop length of a feedback loop (150→180→160→170→150) in the first mode; the inherent delay of the feedback loop in the second mode therefore is larger than the inherent delay of the feedback loop in the first mode.

In the second mode, the fine adjustment circuit 150Y shown in FIG. 3 is used for duty adjustment. Therefore, the duty adjustment amount in each second cycle T2 is PT2 (<PT1). Therefore, in each second cycle T2, the duty ratio of the internal clock signal LCLK is changed by the adjustment amount PT2 so as to approach 50%. Finally, the duty ratio becomes stable at around 50%.

In that manner, according to the present embodiment, the DLL circuit 100 operates in the first mode in an early stage of duty-control. Then, when the duty ratio of the internal clock signal PCLK1 has exceeded 50%, the DLL circuit 100 shifts to the second mode. Therefore, in the early stage in which the duty ratio likely would be far away from 50%, the duty ratio can be quickly changed. Moreover, the internal clock signal PCLK1 whose duty ratio is close to 50% can be input to the delay line 110. Therefore, it is possible to prevent the pulse from being lost as the internal clock signal passes through the delay line 110. After the DLL circuit 100 shifts to the second mode, the duty ratio of the internal clock signal LCLK, which is the output signal of the DLL circuit 100, can be precisely controlled so as to be near 50%.

Figure 5:
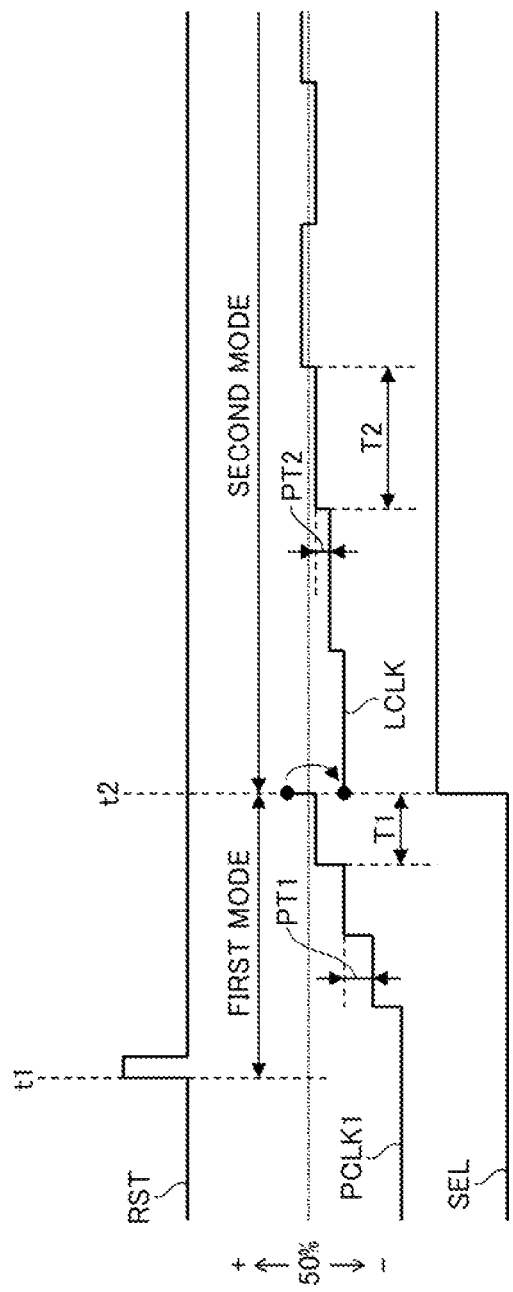
FIG. 5 is a timing chart indicative of another embodiment of a duty adjustment operation by the DLL circuit shown in FIG. 1

Incidentally, as the DLL circuit 100 shifts from the first mode to the second mode, the duty-ratio detection target is shifted from the internal clock signal PCLK1 to the internal clock signal LCLK. Therefore, as shown in FIG. 5, the continuity of the duty ratio detected might be lost immediately after the DLL circuit 100 shifts to the second mode. However, at a time when the DLL circuit 100 shifts from the first mode to the second, mode, the duty ratio of the internal clock signal PCLK1 input to the delay line 110 is substantially equal to 50%. Therefore, immediately after the DLL circuit 100 shifts to the second mode, the duty ratio of the internal clock signal LCLK is expected to foe close to 50%. However, if the duty ratio of the internal clock signal. LCLK is far away from 50% immediately after the DLL circuit 100 shifts to the second mode, first the operation of the coarse adjustment circuit 150X may be performed, and then the operation of the fine adjustment circuit 150Y may be performed.

A circuit example of the duty correction circuit 150 will foe given in more detail. However, the circuit configuration of the duty correction circuit 150 used in the present invention is not limited to this configuration.

Turning to FIG. 5, the duty correction circuit 150 includes four duty adjustment units 151 to 154 and a synthesis circuit 155. The duty adjustment units 151 and 152 are connected in series, forming a propagation path A. The duty adjustment units 153 and 154 are connected in series, forming a propagation path B. The propagation paths A and B run parallel to each other. The Internal clock signal PCLKA1 output from the propagation path A, and the internal clock signal PCLKB1 output from the propagation path B are input to the synthesis circuit 155, which then outputs the internal clock signal PCLK1. The duty adjustment units 151 to 154 are equivalent to the coarse adjustment circuit 150X shown in FIG. 3, and the synthesis circuit 155 is equivalent to the fine adjustment circuit 150Y shown in FIG. 3.

The duty adjustment units 151 to 154 have the same circuit configuration; each unit is designed to change the slew rate of either the rising or failing edge of the internal clock signal. Different control signals are used for the adjustment of slew rates by the duty adjustment units 151 to 154. More specifically, control signals P1 and N1 are used for the duty adjustment unit 151; control signals P2 and N2 are used for the duty adjustment unit 152; control signals P3 and N3 are used for the duty adjustment unit 153; and control signals P4 and N4 are used for the duty adjustment unit 154. Those control signals P1 to P4 and N1 to K4 are part (e.g., count value CNTX) of the above-described duty control signal D2.

Figure 7:
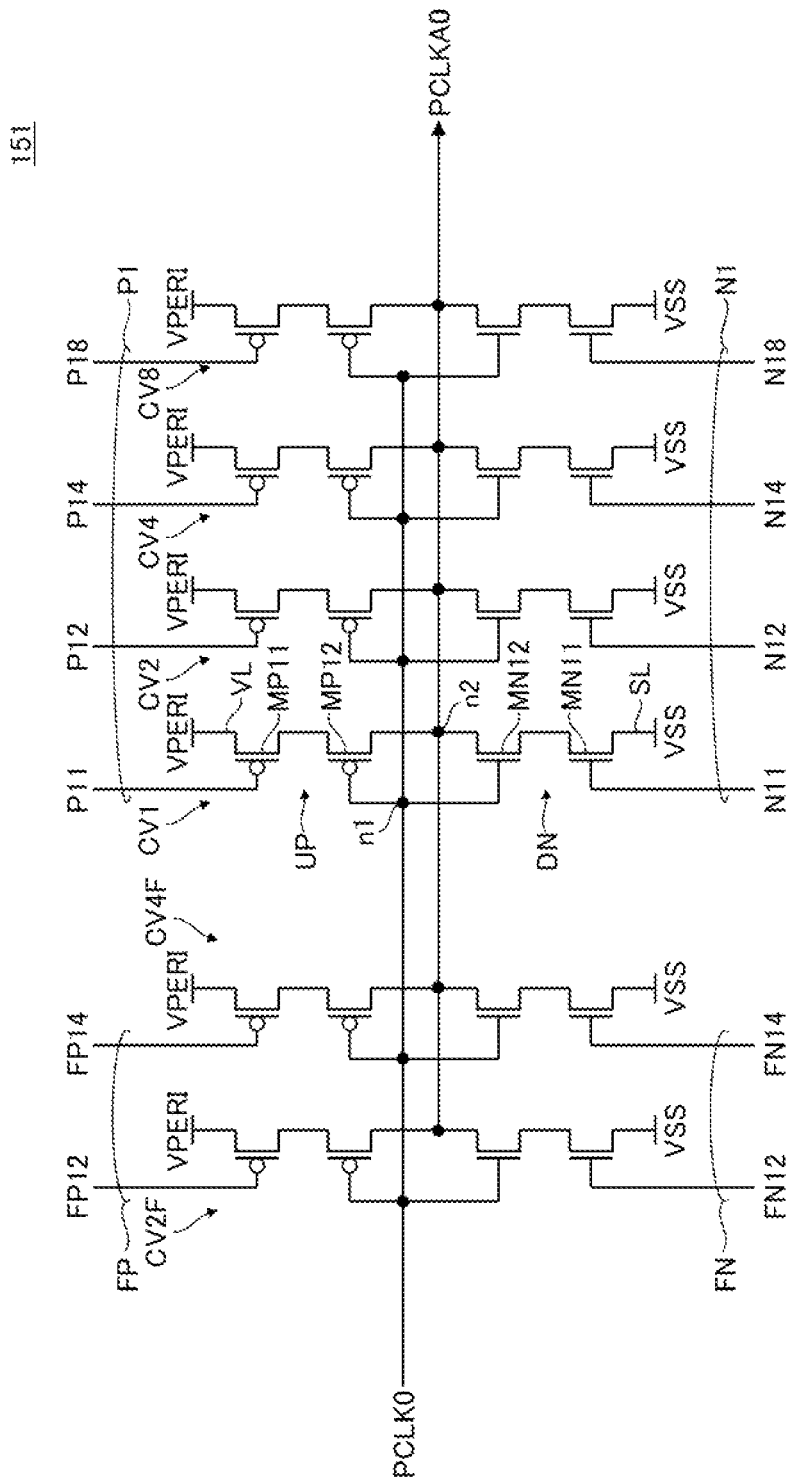
FIG. 7 is a circuit diagram of indicative of an embodiment of a duty adjustment unit shown in FIG. 6.

Turning to FIG. 7, the duty adjustment unit 151 includes six clocked inverters CV1, CV2, CV4, CV8, CV2F and CV4F, which are connected in parallel; the duty adjustment unit 151 receives the internal clock signal PCLK0 and then generates the internal clock signal PCLKA0. Those clocked inverters have the same circuit configuration; only the configuration of the clocked inverter CV1 therefore will be described. The clocked inverter CV1 includes P-channel MOS transistors MP11 and MP12 and N-channel MOS transistors MN12 and MN11, which are connected in series in that order between a power supply wire VL, to which internal potential VPERI is supplied, and a power supply wire SL, to which ground potential VSS is supplied.

The gate electrodes of the transistors MP12 and MN12 are connected in common, forming an input node n1 to which the internal clock signal PCLK0 is supplied. The drains of the transistors MP12 and MN12 are connected in common, forming an output node n2 from which the internal clock signal PCLKA0 is output.

To the gate electrode of the transistor MP11, a control signal P11, which is part of the control signal P1, is supplied. When the control signal P11 is activated to low level, the clocked inverter CV1 is therefore able to pull up the output node n2 based on the level of the input node n1. When the control signal P11 is inactivated to high level, the clocked inverter CV1 is unable to pull up the output node n2. In this manner, the transistors MP11 and MP12 that are connected in series make up a pull-up circuit UP, which is selectively activated by the control signal P11.

Similarly, to the gate electrode of the transistor MN11, a control signal N11, which is part of the control signal N1, is supplied. When the control signal M11 is activated to high level, the clocked inverter CV1 is therefore able to pull down the output node n2 based on the level of the input node n1. When the control signal N11 is inactivated to low level, the clocked inverter CV1 is unable to pull down the output node n2. In this manner, the transistors MN11 and MN12 that are connected in series make up a pull-down circuit DN, which is selectively activated by the control signal N11.

In that manner, the clocked inverter CV1 can separately control the pull-up circuit UP and the pull-down circuit DN. This configuration is different from that of a typical clocked inverter.

The other clocked inverters CV2, CV4, CV8, CV2F and CV4F have the same configuration as the above clocked inverter CV1 except that other corresponding control signals are input to the clocked inverters CV2, CV4, CV8, CV2F and CV4P.

In this case, the drive capabilities of the clocked inverters CV1, CV2, CV4 and CV8 are weighted by the power of 2. More specifically, if the drive capability of the clocked inverter CV1 is 1 DC, the drive capabilities of the clocked inverters CV2, CV4 and CV8 are 2 DC, 4 DC and 8 DC, respectively. Accordingly, based on the control signals P11, P12, P14 and P18 that make up the control signal P1, the pull-up capability can foe controlled in 16 stages (0 DC to 15 DC). Furthermore, based on the control signals N11, N12, N14 and N18 that make up the control signal N1, the pull-down capability can be controlled in 16 stages (0 DC to 15 DC). The control signals P1 and N1 are generated by the DCC control circuit 170 based on the duty detection signal D1 output from the duty cycle detector 160.

Figure 8:
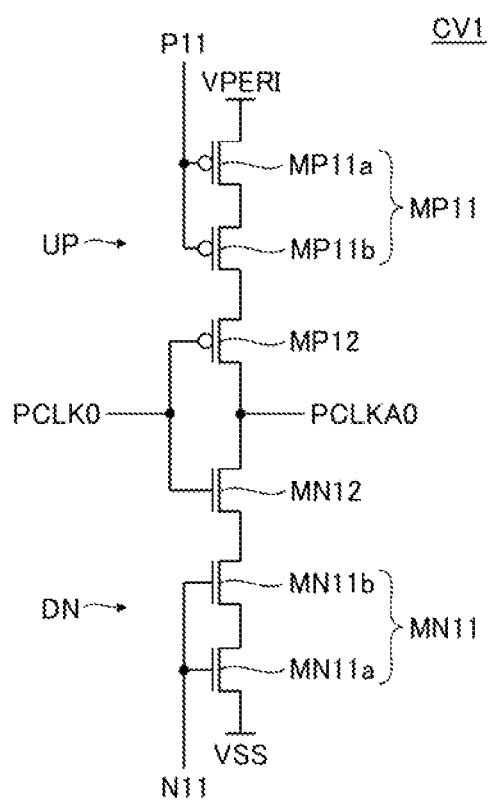
FIG. 8 is a circuit diagram of indicative of an embodiment of a clocked inverter according to a modified example.

Incidentally, if restrictions in the process make it difficult to make transistors whose drive capability is less than 2 DC, the transistors MP11 and MN11 each may be made up of two transistors that are connected in series, as shown in FIG. 8. In the example shown in FIG. 8, the two P-channel MOS transistors MP11a and MP11b that make up the transistor MP11 each have a drive capability of 2 DC; because the P-channel MOS transistors MP11a and MP11b are connected in series, it is possible to obtain a drive capability of IDC. Similarly, the two N-channel MOS transistors MN11a and MN11b that make up the transistor MN11 each have a drive capability of 2 DC; because the N-channel MOS transistor's MN11a and MN11b are connected in series, it is possible to obtain a drive capability of IDC.

Meanwhile, the clocked inverters CV2F and CV4F are circuits that offer fixed drive capabilities to the duty adjustment unit 151; the drive capabilities of the clocked inverters CV2F and CV4F are 2 DC and 4 DC, respectively. Fuse signals FP and FN are used to select whether or not to activate the clocked inverters CV2P and CV4F. For example, the fuse signals FP12 and FN12 are activated to activate only the clocked inverter CV2F; the fuse signals FP14 and FN14 are activated to activate only the clocked inverter CV4F.

As for the clocked inverters CV2F and CV4F, there is no need to separately control the pull-up circuit UP and the pull-down circuit DM; the pull-up circuit UP and the pull-down circuit DM may be controlled in common as in the case of a typical clocked inverter. In this case, in the activated clocked inverters CV2F and CV4F, it is possible to both pull up and pull down. In the inactivated clocked inverters CV2F and CV4F, the output is in a high impedance state.

Figure 9:
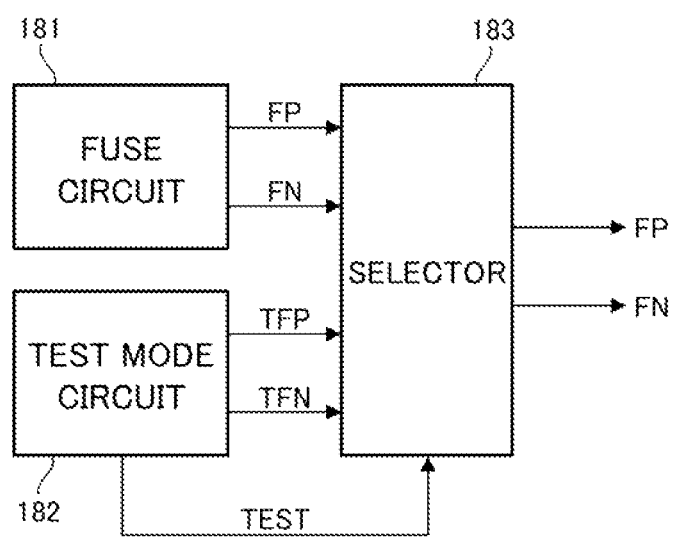
FIG. 9 is a block diagram indicative of an embodiment of a circuit that generates the fuse signals.

Turning to FIG. 9, the fuse signals FP and FN are stored in a fuse circuit 181. The fuse circuit 181 is a nonvolatile storage circuit that includes optical fuse elements, electric ail fuse elements (anti-fuse elements), and the like. In a production stage, programming of the fuse signals FP and FN is performed. The fuse signals FP and FN that are output from the fuse circuit 181 are supplied to the duty correction circuit 150 via a selector 183.

In order to make the fuse signals FP and FN variable during a test operation, a test mode circuit 182 is provided. The test mode circuit 182 is able to output any test fuse signals TFP and TFN. By activating a test signal TEST, the test fuse signals TFP and TFN can be supplied to the duty correction circuit 150 via the selector 183.

In that manner, whether or not to use the clocked inverters CV2F and CV4F is fixed except during the test operation. Accordingly, the switching of the pull-up and pull-down capabilities by the duty adjustment unit 151 is conducted only in 16 stages in each case. However, when the clocked inverters CV2F and CV4F are used, the adjustment ratio of the pull-up and pull-down capabilities by the duty adjustment unit 151 is changed. For example, when only the clocked inverter CV2F is used, the drive capability of the duty adjustment unit 151 can be adjusted within a range of 2 DC to 17 DC; when both the clocked inverters CV2F and CV4F are used, the drive capability of the duty adjustment unit 151 can foe adjusted within a range of 6 DC to 21 DC. In the former case, the adjustment rate, or the rate of maximum drive capability to minimum drive capability, stands at 8.5 (=17/2). In the latter case, the adjustment rate is 3.5 (=21/6). The former is suitable for the case where the duty adjustable range should be large, such as for relatively-slow products, for example. The latter is suitable for the case where the duty's minimum adjustment pitch should be finer, such as for relatively-high-speed products, for example. In this manner, according to the present embodiment, the duty adjustable range and the minimum adjustment pitch can be easily changed.

According to the above-described configuration, the rising waveform of the internal clock signal PCLKA0 output from the duty adjustment unit 151 is controlled based on the control signals P1 and FP; the falling waveform is controlled based on the control signals N1 and FN.

The other duty adjustment units 152 to 154 have the same circuit configuration as the above duty adjustment unit 151 except that other corresponding control signals are input to the duty adjustment units 152 to 154. The duty adjustment unit 152 receives the internal clock signal PCLKA0 and then generates the internal clock signal PCLKA1. The duty adjustment unit 153 receives the internal clock signal PCLK0 and then generates the internal clock signal PCLKB0. The duty adjustment unit 154 receives the Internal clock signal PCLKB0 and then generates the internal clock signal PCLKB1. Both the internal clock signals PCLKA1 and PCLKB1 are supplied to the synthesis circuit 155.

Figure 10:
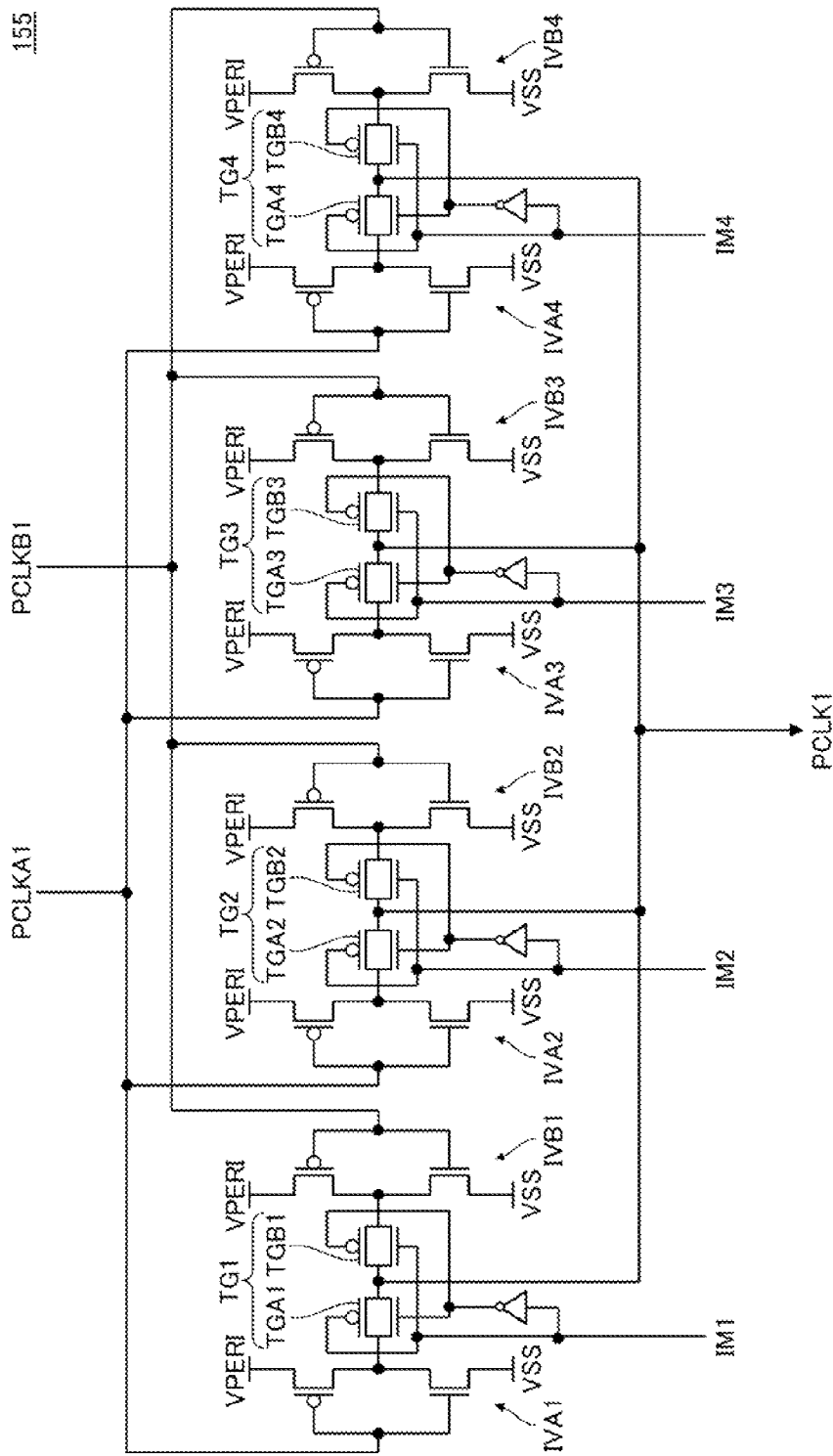
FIG. 10 is a circuit diagram of indicative of an embodiment of a synthesis circuit 155 shown in FIG. 6.

Turning to FIG. 10, the synthesis circuit 155 includes four inverter circuits IVA1 to IVA4, to which the internal clock signal PCLKA1 is input; and four inverter circuits IVB1 to IVB4, to which the internal clock signal PCLKB1 is input. The synthesis circuit 155 also includes pair's of transfer gates TG1 to TG4. One of each pair of the transfer gates TG1 to TG4 is made conductive in response to corresponding one of control signals IM1 to IM4. Outputs of the inverter circuits IVA1 to IVA4 and IVB1 to IVB4 are combined through the conductive sides of the transfer-gate pairs TG1 to TG4.

More specifically, the output nodes of the inverter circuits IVA1 to IVA4 are short-circuited through the transfer gates TGA1 to TGA4; the output nodes of the inverter circuits IVB1 to IVB4 are short-circuited through the transfer gates TGB1 to TGB4. Of two transfer gates (e.g., TGA1 and TGB1) that make up each of the transfer-gate pairs TG1 to TG4, one transfer gate is made conductive in response to corresponding control signals IM1 to IM4. Therefore, the synthesis ratio of the internal clock signals PCLKA1 and PCLKB1 can be controlled according to the control signals IM1 to IM4.

For example, three of the transfer gates TGA1 to TGA4 are made conductive, and one of the transfer gates TGB1 to TGB4 is made conductive. In this case, the internal clock signals PCLKA1 and PCLKB1 are combined with a synthesis ratio of 3:1, and the internal clock signal PCLK1 is generated as a result. Alternatively, two of the transfer gates TGA1 to TGA4 may be made conductive, and two of the transfer gates TGB1 to TGB4 may be made conductive. In this case, the internal clock signals PCLKA1 and PCLKB1 are combined with a synthesis ratio of 1:1, and the internal clock signal PCLK1 is generated as a result.

Those control signals IM1 to IM4, too, are part (e.g., count value CNTY) of the above-described duty control signal D2. This means that the duty control signal D2 contains the control signals P1 to P4, N1 to N4 and IM1 to IM4. As described above, the duty control signal. D2 is generated by the DCC control circuit 170.

Figure 11:
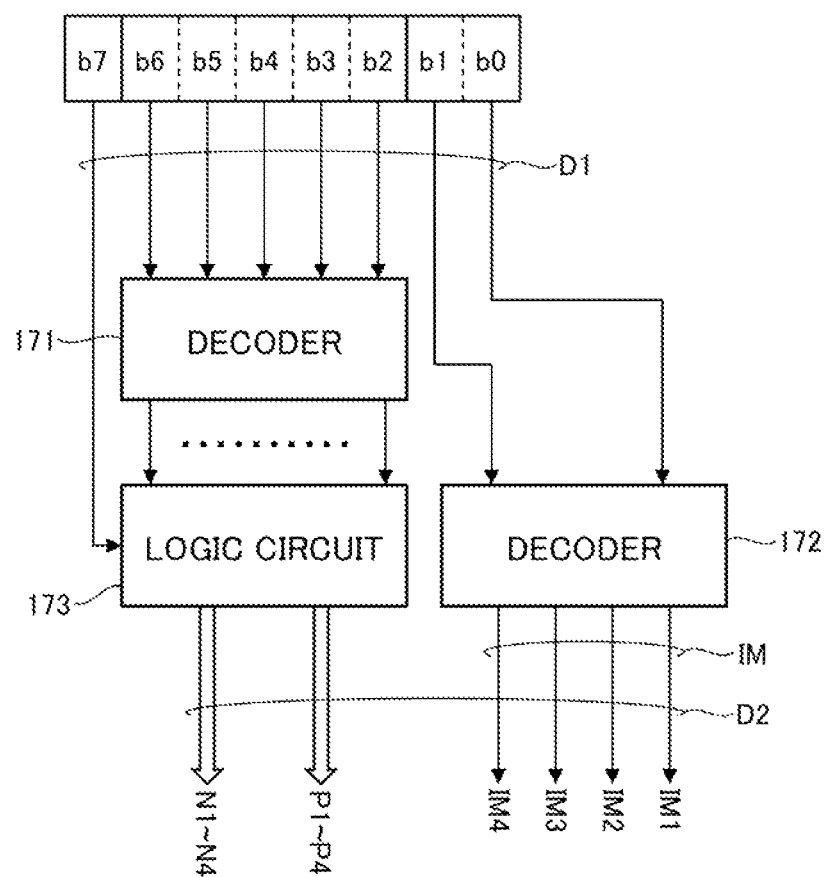
FIG. 11 is a block diagram schematically indicative of an embodiment of a configuration of the DCC control circuit shown in FIG. 2.

Turning to FIG. 11, the DCC control circuit 170 receives, for example, an eight-bit duty detection signal D1 output from the duty cycle detector 160, and decodes and performs a logic operation of the duty detection signal D1, thereby generating a duty control signal D2. Although not specifically limited, the duty detection signal D1 of the present embodiment is an eight-bit binary signal: the high six bits b7 to b2 of the signal are used to generate the control signals P1 to P4 and N1 to N4, and the low two bits b1 and b0 of the signal are used to generate the control signals IM1 to IM4. In particular, the highest bit b7 is used as a signal indicating whether the duty ratio is less than 50% or greater than 50%. This means that, if the value of the duty detection signal D1 is less than or equal to "01111111b", the duty ratio of the internal clock signal LCLK is less than 50%; and that, if the value of the duty detection signal D1 is greater than or equal to "10000000b", the duty ratio of the internal clock signal LCLK is greater than 50%. In this case, the above-described switch signal SEL may be activated when the highest bit b7 is inverted.

As shown in FIG. 11, the DCC control circuit 170 includes a decoder 171, which decodes bits b6 to b2 of the duty detection signal D1; a decoder 172, which decodes bits b1 and b0 of the duty detection signal D1; and a logic circuit 173, which conducts a logic operation based on output signals of the decoder 171 and the highest bit b7 of the duty detection signal D1. If the highest bit b7 is 0, or if the duty ratio of the internal clock signal LCLK is less than 50%, the logic circuit 173 generates the control signals P1 to P4 and N1 to N4 so that the drive capability of the duty correction circuit 150 becomes smaller as the values of the bits b6 to b2 become smaller. If the highest bit b7 is 1, or if the duty ratio of the internal clock signal LCLK is greater than 50%, the logic circuit 173 generates the control signals P1 to P4 and N1 to N4 so that the drive capability of the duty correction circuit 150 becomes smaller as the values of the bits b6 to b2 become larger. Outputs of the decoder 172 are used as the control signals IM1 to IM4.

In this case, the control signals P1, P3, N2 and N4 constitute a first control signal; if the highest bit b7 is 0, or if the duty ratio of the internal clock signal LCLK is less than 50%, the value thereof is controlled according to the actual duty ratio. In this case, the control signals P2, P4, N1 and N3 that constitute a second control signal are fixed at maximum values. The control signals P1, P3, N2 and N4 take values that are related to each other. According to the present embodiment, P1=P3 and N2=N4; P1 and P3 are inverted signals of N2 and N4. Therefore, the control signals P1, P3, N2 and N4 can be generated so as to derive from one type of control-signal.

Similarly, the control signals P2, P4, M1 and N3 constitute the second control signal; if the highest bit b7 is 1, or if the duty ratio of the internal clock signal LCLK is greater than 50%, the value thereof is controlled according to the actual duty ratio. In this case, the control signals P1, P3, N2 and N4 that constitute the first control signal are fixed at maximum values. As described later, the control signals P2, P4, N1 and N3 take values that are related to each other. According to the present embodiment, P2=P4 and N1=N3; P2 and P4 are inverted signals of N1 and N3. Therefore, the control signals P2, P4, N1 and N3 can be generated so as to derive from one type of control signal.

Figure 12:
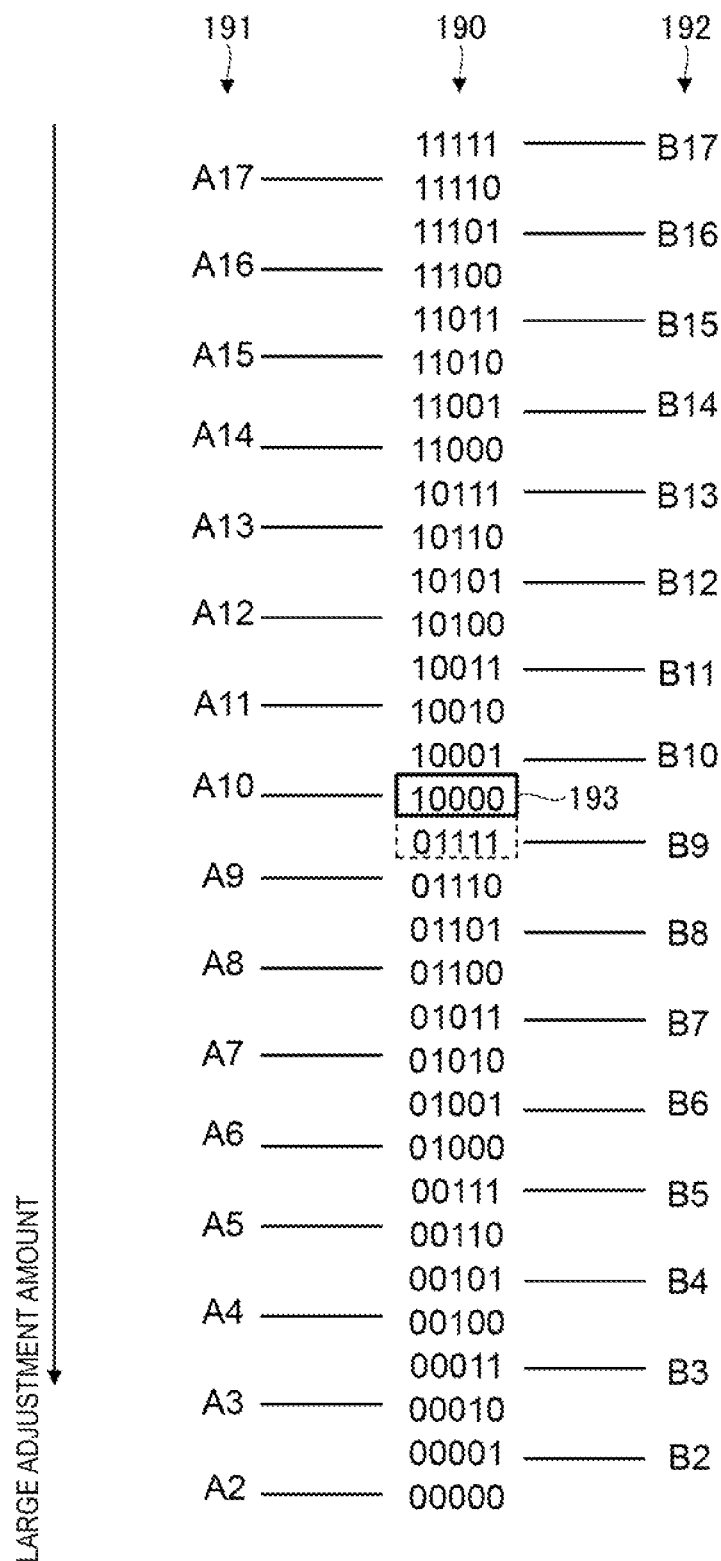
FIG. 12 is a schematic diagram indicative of an embodiment of a relationship between the values of bits of the duty detection signal shown in FIG. 11 and drive capability when the duty ratio is less than 50%.
Figure 13:
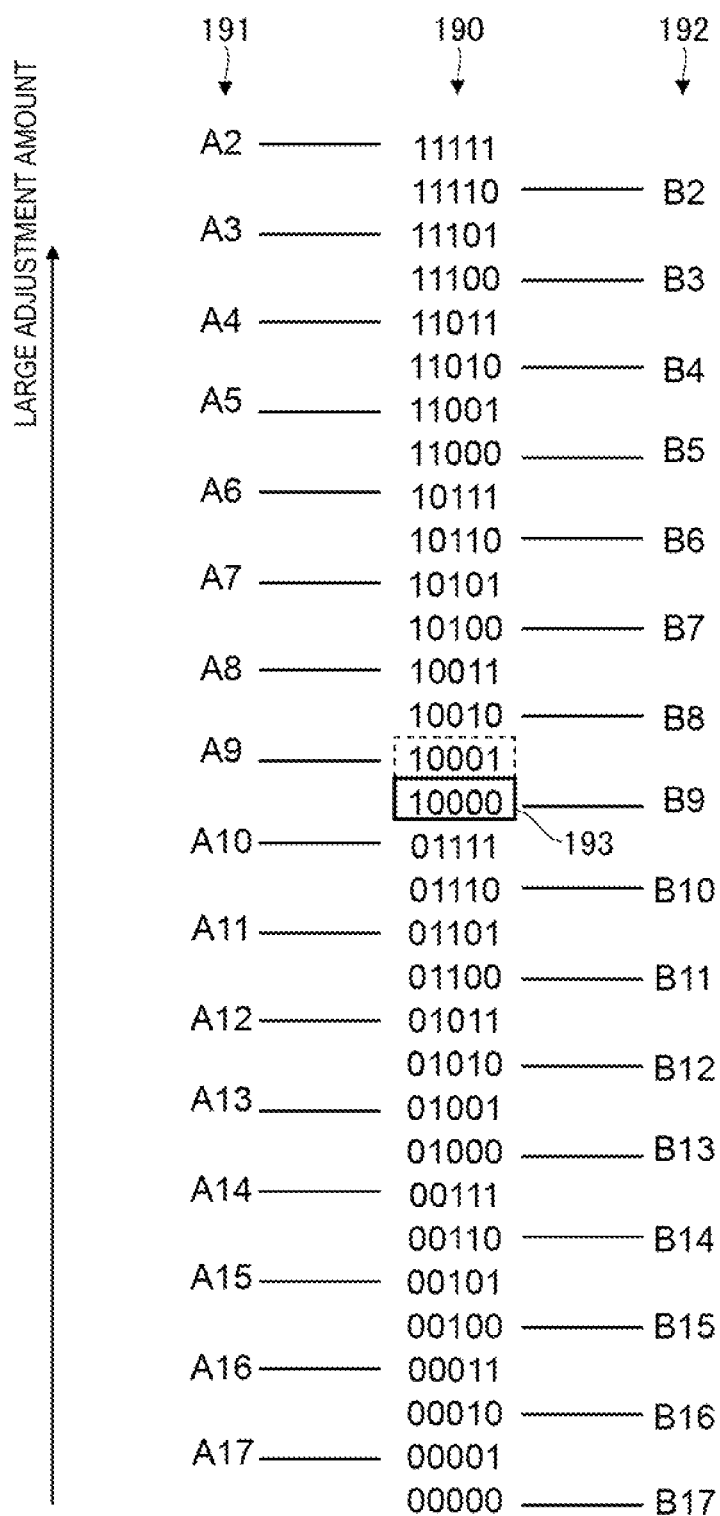
FIG. 13 is a schematic diagram indicative of an embodiment of a relationship between the values of bits of the duty detection signal shown in FIG. 11 and drive capability when the duty ratio is greater than 50%.

Turning to FIGS. 12 and 13, FIG. 12 shows the case where the duty ratio is less than 50% and FIG. 13 shows the case where the duty ratio is over 50%.

Reference symbol 190 in FIGS. 12 and 13 represents the values of bits b6 to b2 of the duty detection signal D1: there are 32 such values in total. If the duty ratio is less than 50%, the duty ratio becomes smaller as the values of bits b6 to b2 decrease. If the duty ratio is greater than 50%, the duty ratio becomes larger as the values of bits b6 to b2 increase. Reference symbol 191 represents the adjustment amount of the propagation path A, and reference symbol 192 represents the adjustment amount of the propagation path B.

In this case, the adjustment amounts A2 to A17 and B2 to B17 are adjustment amounts corresponding to the above-described drive capabilities 2 DC to 17 DC. However, the adjustment amounts A2 to A17 of the propagation path A is so designed as to be 0.5 DC smaller in drive capability than the adjustment amounts B2 to B17 of the propagation path B.

A process of setting the adjustment amounts of the propagation paths A and B in accordance with the values of bits b6 to b2 is performed in the following manner.

First, if the duty ratio is less than 50% and if the values of bits b6 to b2 are "10000b" as indicated by reference symbol 133 in FIG. 12, then the adjustment amount of the propagation path A is set to a corresponding A10. Meanwhile, the adjustment amount of the propagation path B is set to B9, which is one pitch larger than the adjustment amount A10. In this case, if the duty ratio is less than 50%, the drive capabilities of the pull-up circuits UP in the duty adjustment units 151 and 153 are always adjusted by the control signals P1 and P3, while the drive capabilities of the pull-down circuits DN are fixed to maximum values. The drive capabilities of the pull-down circuits DN in the duty adjustment units 152 and 154 are adjusted by the control signals N2 and N4, while the drive capabilities of the pull-up circuits UP are fixed to maximum values.

Figure 14:
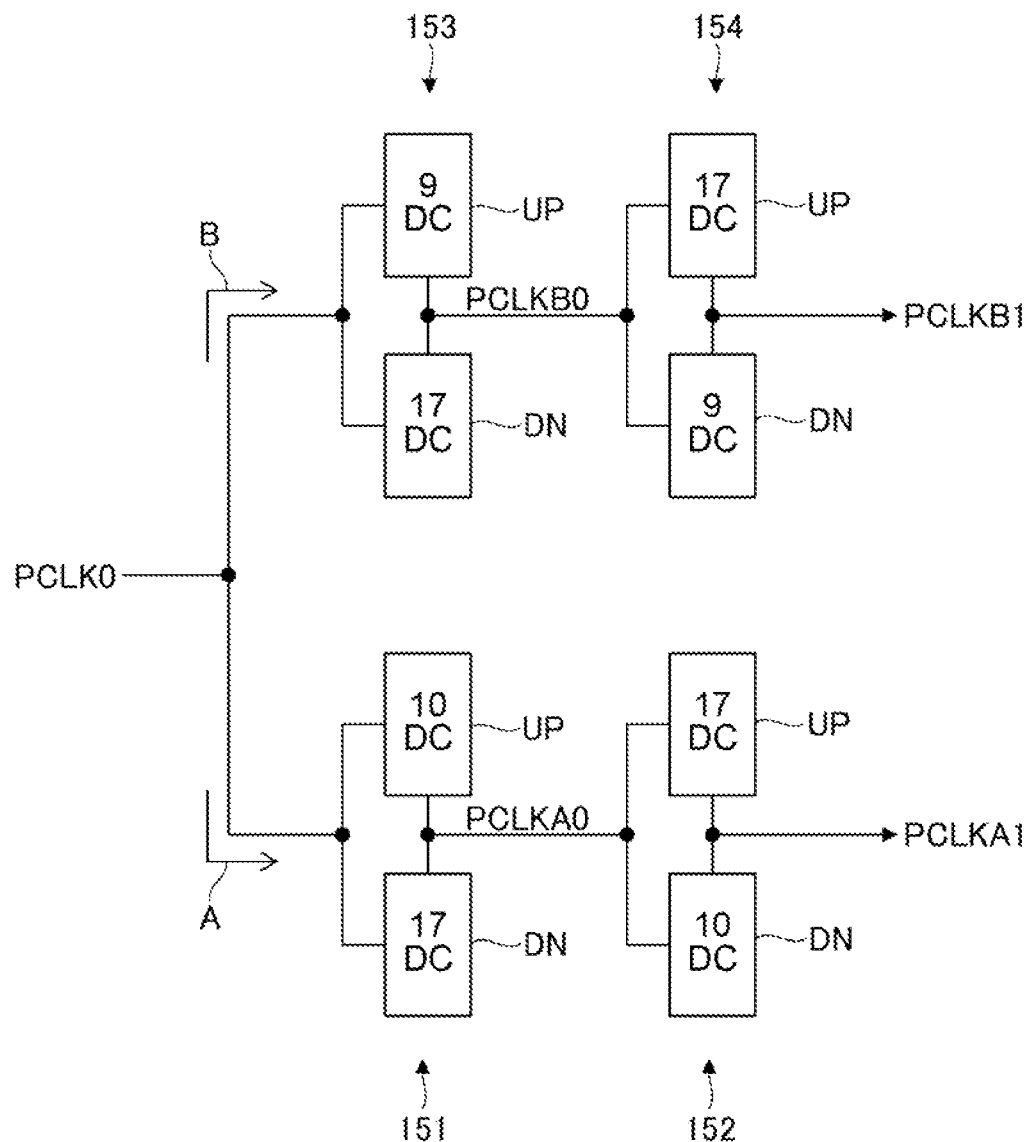
FIG. 14 is a schematic diagram for explaining adjustment amounts by duty adjustment units shown in FIG. 6, when the duty ratio is less than 50%.

Therefore, in this example, as shown in FIG. 14, the drive capabilities of the pull-up circuits UP in the duty adjustment units 151 and 153 are set to 10 DC and 9 DC, respectively; the drive capabilities of the pull-down circuits DN in the duty adjustment units 152 and 154 are set to 10 DC and 9 DC, respectively. The other pull-up circuits UP and pull-down circuits DN are set to a maximum drive capability (17 DC). As a result, as the internal clock signal PCLK0 is input, the rising edges of the internal clock signals PCLKA0 and PCLKB0 become blunt, and the falling edges of the internal clock signals PCLKA1 and PCLKB1 become blunt.

Figure 15:
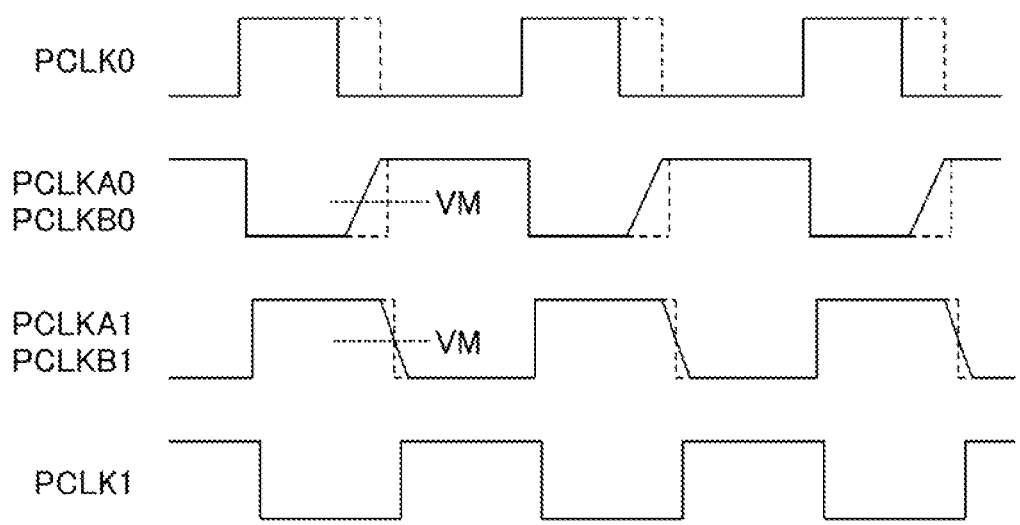
FIG. 15 is a waveform diagram indicative of an embodiment of changes in the duty ratio of the internal clock signals when the duty ratio is less than 50%.

Turning to FIG. 15, solid line represents the actual waveform, and broken line represents the waveform of the case where the duty ratio is 50%. The same is true for FIG. 17, which will be described later.

As described above, if the duty ratio is less than 50%, the pull-up capability is adjusted by the first-stage duty adjustment units 151 and 153 so as to become smaller. Therefore, the rising edges of the internal clock signals PCLKA0 and PCLKB0 become blunt in accordance with the pull-up capability. In this case, the logic threshold values of the next-stage duty adjustment units 152 and 154 have been set to intermediate potential VM. Therefore, the timing at which the input levels in the duty adjustment units 152 and 154 are switched from low level to high level is delayed. This means that the failing edges of the internal clock signal PCLK0 are delayed. As a result, the duty ratio expands.

Furthermore, in the next-stage duty adjustment units 152 and 154, the pull-down capability is so adjusted as to become smaller. Therefore, the falling edges of the internal clock signals PCLKA1 and PCLKB1 become blunt in accordance with the pull-down capability. In this case, the logic threshold value of the next-stage synthesis circuit 155 has been set to intermediate potential VM. Therefore, the timing at which the input level in the synthesis circuit 155 is switched from high level to low level is delayed. This means that the falling edges of the internal clock signal PCLK0 are further delayed. As a result, the duty ratio further expands. According to this principle, the duty ratio expands to around 50%.

If the duty ratio is greater than 50%, and if the values of bits b6 to b2 are "10000b" as indicated by reference symbol 193 in FIG. 13, then the adjustment amount of the propagation path A is set to a corresponding A9. Meanwhile, the adjustment amount of the propagation path B is set to B9, which is one pitch larger than the adjustment amount A9. In this case, if the duty ratio is greater than 50%, the drive capabilities of the pull-down circuits DN in the duty adjustment units 151 and 153 are always adjusted by the control signals N1 and N3, while the drive capabilities of the pull-up circuits UP are fixed to maximum values. The drive capabilities of the pull-up circuits UP in the duty adjustment units 152 and 154 are adjusted by the control signals P2 and P4, while the drive capabilities of the pull-down circuits DN are fixed to maximum values.

Figure 16:
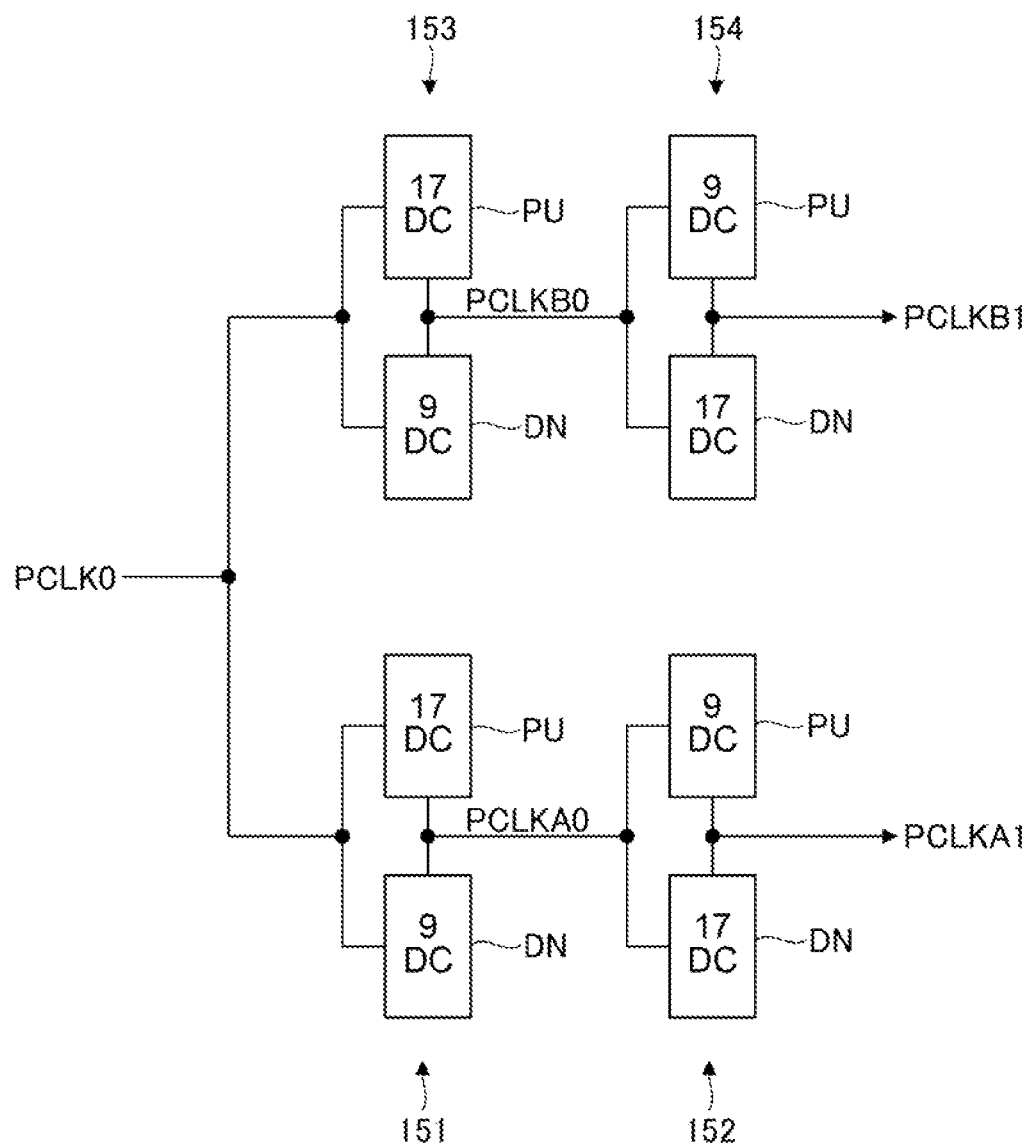
FIG. 16 is a schematic diagram for explaining adjustment amounts by duty adjustment units shown in FIG. 6, when the duty ratio is greater than 50%.

Therefore, in this example, as shown in FIG. 16, the drive capabilities of the pull-down circuits DN in the duty adjustment units 151 and 153 are set to 9 DC; the drive capabilities of the pull-up circuits UP in the duty adjustment units 152 and 154 are set to 9 DC. The other pull-up circuits UP and pull-down circuits DN are set to a maximum drive capability (17 DC). As a result, as the internal clock signal PCLK0 is input, the falling edges of the internal clock signals PCLKA0 and PCLKB0 become blunt, and the rising edges of the internal clock signals PCLKA1 and PCLKB1 become blunt.

Figure 17:
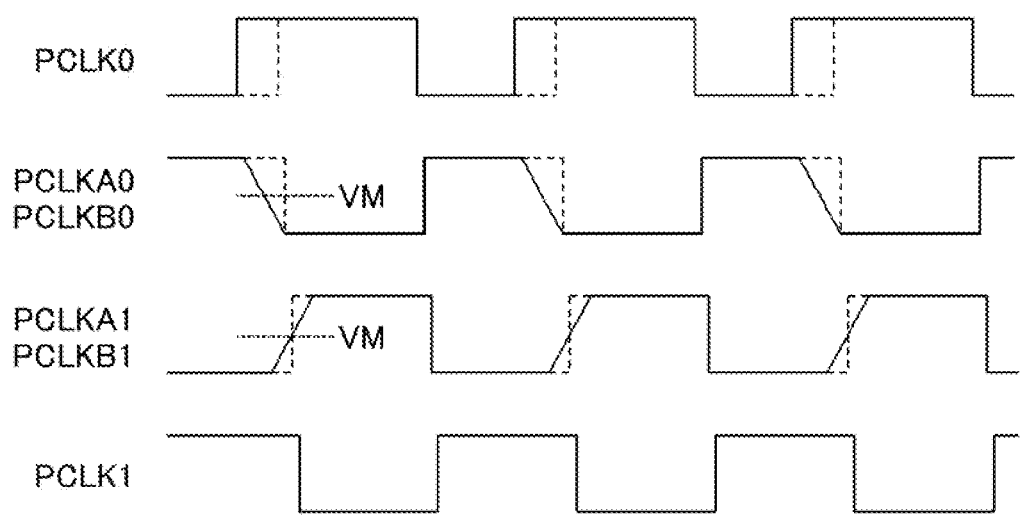
FIG. 17 is a waveform diagram indicative of an embodiment of changes in the duty ratio of the internal clock signals when the duty ratio is greater than 50%.

Turning to FIG. 17, as described above, if the duty ratio is greater than 50%, the pull-down capability is adjusted by the first-stage duty adjustment units 151 and 153 so as to become smaller. Therefore, the falling edges of the internal clock signals PCLKA0 and PCLKB0 become blunt in accordance with the pull-down capability. In this case, the logic threshold values of the next-stage duty adjustment units 152 and 154 have been set to intermediate potential VM. Therefore, the timing at which the input, levels in the duty adjustment units 152 and 154 are switched from high level to low level is delayed. This means that the rising edges of the internal clock signal PCLK0 are delayed. As a result, the duty ratio decreases.

Furthermore, in the next-stage duty adjustment units 152 and 154, the pull-up capability is so adjusted as to become smaller. Therefore, the rising edges of the internal clock signals PCLKA1 and PCLKB1 become blunt in accordance with the pull-up capability. In this case, the logic threshold value of the next-stage synthesis circuit 155 has been set to intermediate potential VM. Therefore, the timing at which the input level in the synthesis circuit 155 is switched from low level to high level is delayed. This means that the rising edges of the internal clock signal PCLK0 are further delayed. As a result, the duty ratio further decreases. According to this principle, the duty ratio decreases to around 50%.

In that manner, the logic circuit 173 in the DCC control circuit 170 generates the control signals P1 to P4 and N1 to N4 based on the values of bits b to b2 of the duty detection signal D1, thereby controlling the drive capabilities of the duty adjustment units 151 to 154 and generating the two internal clock signals PCLKA1 and PCLKB1. As described above, the difference between the adjustment amount of the propagation path A and the adjustment amount of the propagation path B is 0.5 DC when measured in drive capability. Therefore, the difference between the duty ratio of the internal clock signal PCLKA1 and the duty ratio of the internal clock signal PCLKB1 is equal to a minimum pitch, which is equivalent to 0.5 DC in drive capability. The internal clock signals PCLKA1 and PCLKB1 having the above duty difference are input to the synthesis circuit 155.

Figure 18A:
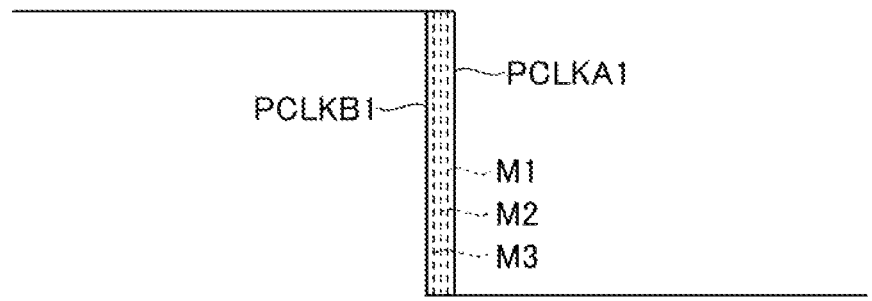
FIG. 18A is a waveform diagram indicative of an embodiment of operation of the synthesis circuit when the duty ratio is less than 50%.

Turning to FIG. 18A, when the duty ratio is less than 50%, the falling edges of the internal clock signals PCLKA1 and PCLKB1 are delayed with respect to the internal clock signal PCLK0. Moreover, the falling edge of the internal clock signal PCLKA1 is delayed by an amount equivalent to a drive capability of 0.5 DC with respect to the falling edge of the internal clock signal PCLKB1. If these two internal clock signals PCLKA1 and PCLKB1 are combined by the synthesis circuit 155, one of three intermediate phases M1, M2 and M3 can be obtained depending on the values of the control signals IM1 to IM4.

Figure 18B:
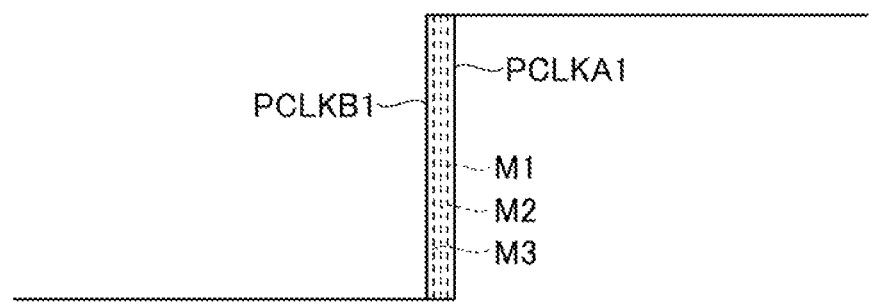
FIG. 18B is a waveform diagram indicative of an embodiment of operation of the synthesis circuit, when the duty ratio is greater than 50%.

Turning to FIG. 18B, when the duty ratio is greater than 50%, the rising edges of the internal clock signals PCLKA1 and PCLKB1 are delayed with respect to the internal clock signal PCLK0. Then, the rising edge of the internal clock signal PCLKA1 is delayed, by an amount equivalent to a drive capability of 0.5 DC with respect to the rising edge of the internal clock signal PCLKB1. If these two internal clock signals PCLKA1 and PCLKB1 are combined by the synthesis circuit 155, one of three intermediate phases M1, M2 and M3 can be obtained depending on the values of the control signals IM1 to IM4.

The intermediate phases M1 to M3 shown in FIG. 18A each represent the falling edge of the internal clock signal PCLK1 that is obtained when the internal clock signals PCLKA1 and PCLKB1 are combined with a synthesis ratio of 3:1, 1:1 and 1:3, respectively. The intermediate phases M1 to M3 shown in FIG. 18B each represent the rising edge of the internal clock signal PCLK1 that is obtained when, the internal clock signals PCLKA1 and PCLKB1 are combined with a synthesis ratio of 3:1, 1:1 and 1:3, respectively. The synthesis ratio is selected by the control signals 1M1 to IM4 based on bits b1 and b0 of the duty detection signal D1.

Incidentally, if the synthesis ratio is set to 1:0, the waveform of the internal clock signal PCLK1 is determined based only on the internal clock signal PCLKA1. If the synthesis ratio is set to 0:1, the waveform of the internal clock signal PCLK1 is determined based only on the internal clock signal PCLKB1. In this manner, the synthesis circuit 155 is able to directly output the waveform that is not an intermediate value. Therefore, the adjustment pitch of the duty ratio can be made highly accurate to ¼ (or the resolution can be quadrupled).

The adjustment of the duty ratio is made by the duty adjustment units 151 to 154 in 32 stages; the resolution is quadrupled by the synthesis circuit 155. Therefore, the duty correction circuit 150 of the present embodiment can ensure 128 stages of adjustment pitches in total. If a duty correction circuit of a type that is designed to fine-tune a bias level of a transistor is used, the duty correction circuit needs to generate 128 levels of bias potential with high precision; a slight noise can cause a large error in the duty ratio. According to the present embodiment, the duty ratio is completely digitally-controlled and is changed without the use of bias potential. Therefore, the noise immunity is high, and the duty adjustment operation can be performed in a stable manner.

Moreover, according to the present embodiment, in the first-stage duty adjustment units 151 and 153, the drive capability of one of the P-channel and N-channel MOS transistors is controlled to adjust the duty ratio. In the next-stage duty adjustment units 152 and 154, the drive capability of the other one of the P-channel and N-channel MOS transistors is controlled to adjust the duty ratio. Therefore, even if there is a difference between the threshold value of the P-channel MOS transistor and the threshold value of the N-channel MOS transistor due to process conditions and the like, a difference in the adjustments of the duty ratio can be offset.

Figure 6:
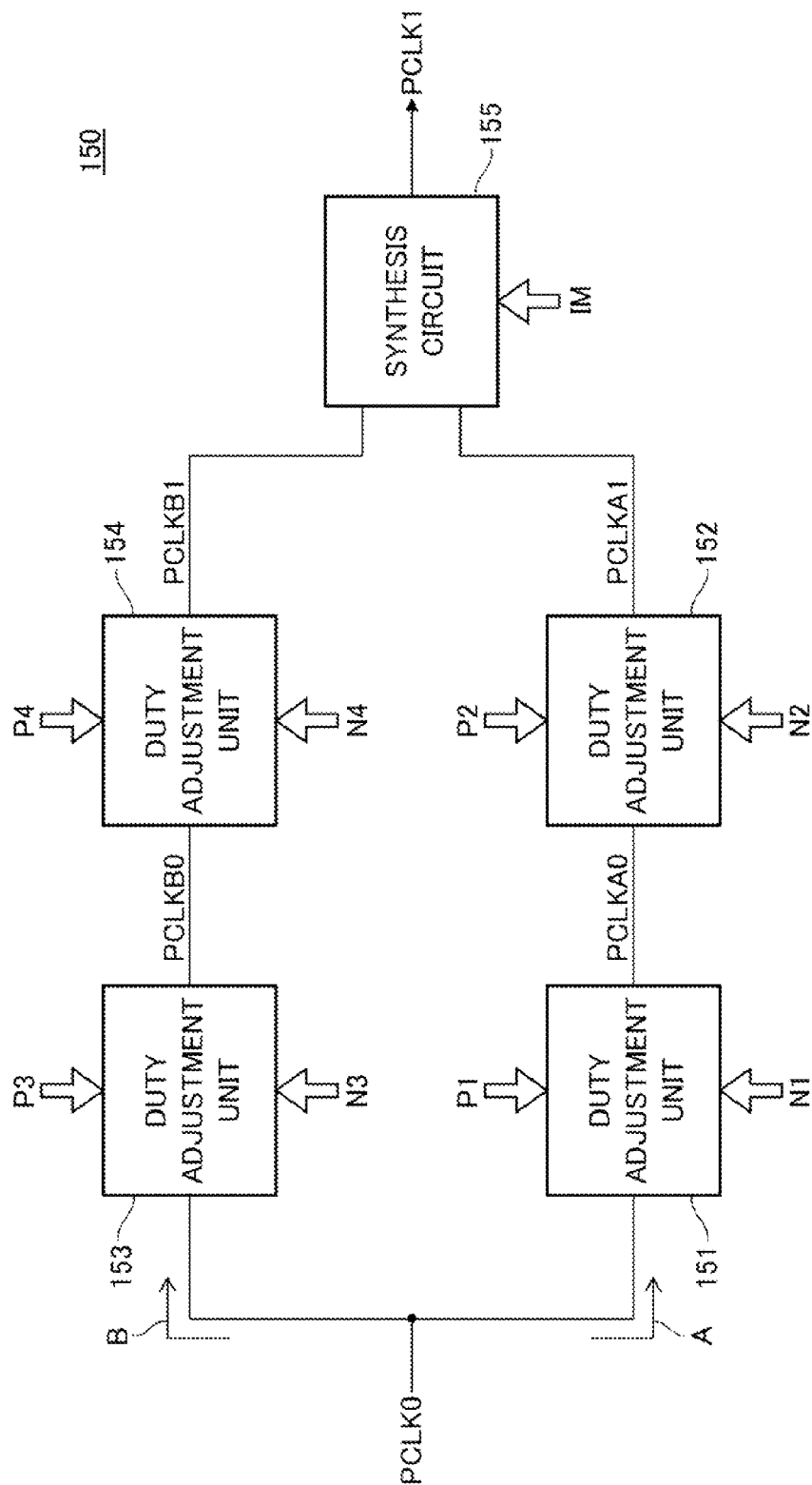
FIG. 6 is a block diagram indicative of an embodiment of a configuration of the duty correction circuit shown in FIG. 2.
Figure 19:
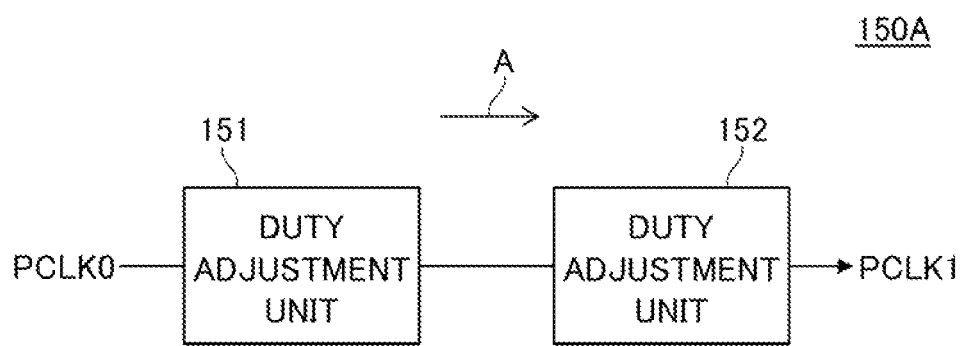
FIG. 19 is a block diagram indicative of an embodiment of a configuration of a duty correction circuit according to a first modified example.

Turning to FIG. 19, the duty correction circuit 150A of the first modified example is different from the duty correction circuit 150 shown in FIG. 6 in that only the propagation path A is used. Accordingly, the synthesis circuit 155 is not used. In this configuration, compared with the duty correction circuit 150 shown in FIG. 6, the adjustment pitch becomes coarser. However, the occupied area can be reduced. Moreover, as in the case of the duty correction circuit 150 shown in FIG. 6, it is possible to offset a difference in the adjustments of the duty ratio, which is attributable to a difference between the threshold values. If the duty correction circuit 150A of the first modified example is used, the minimum adjustment pitch in the first mode is equal to the minimum adjustment pitch in the second mode. That is, such aspects are also included in the present invention.

Figure 20:
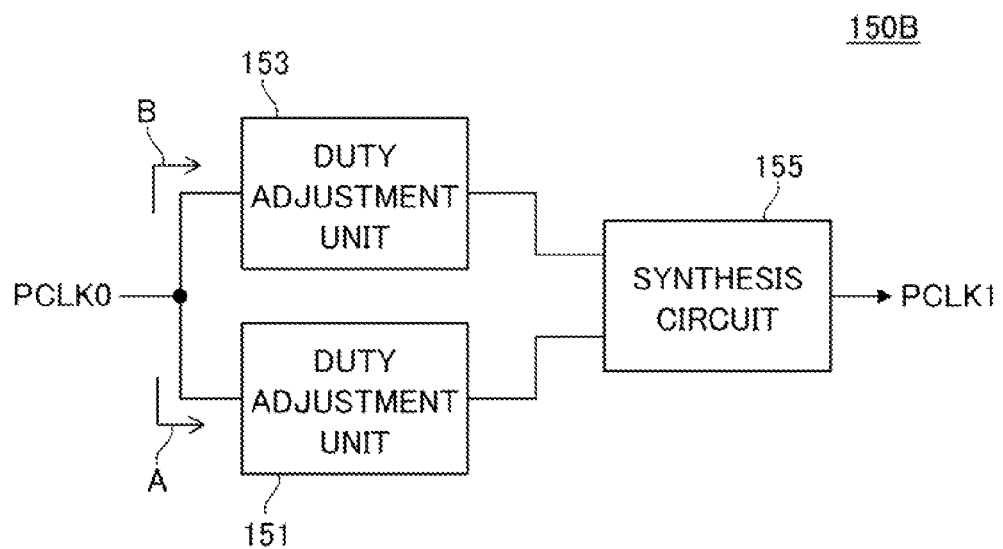
FIG. 20 is a block diagram indicative of an embodiment of a configuration of a duty correction circuit according to a second modified example.

Turning to FIG. 20, the duty correction circuit 150B of the second modified example is different from the duty correction circuit 150 shown in FIG. 6 in that the duty adjustment units 152 and 154 are omitted. In this configuration, it is impossible to offset a difference in the adjustments of the duty ratio, which, is attributable to a difference between the threshold values. However, the occupied area can be reduced, and, as in the case of the duty correction circuit 150 shown in FIG. 6, the fine adjustment pitch can be obtained.

Figure 21:
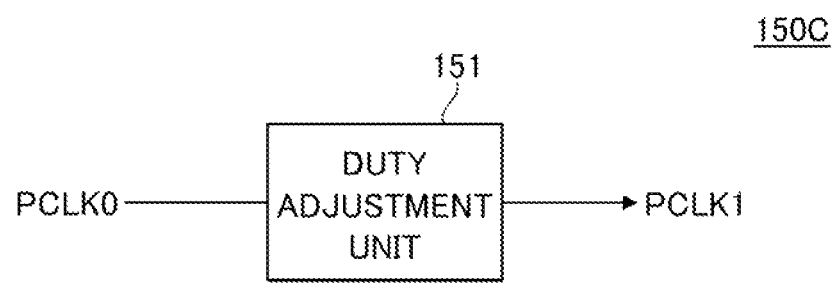
FIG. 21 is a block diagram indicative of an embodiment of a configuration of a duty correction circuit according to a third modified example.

Turning to FIG. 21, the duty correction circuit 150C of the third modified example is different from the duty correction circuit 150 shown in FIG. 6 in that only the duty adjustment unit 151 is used. In this configuration, it is possible to dramatically simplify the circuit configuration. If the duty correction circuit 150C of the third modified example is used, the minimum adjustment pitch in the first mode is equal to the minimum adjustment pitch in the second mode.

It is apparent that the present invention is not limited to the above embodiments, but may be modified and changed without departing from the scope and spirit of the invention.

For example, in the above embodiments, several specific examples of the duty correction circuit have been described with reference to FIGS. 6 to 21. However, according to the present invention, the configuration of the duty correction circuit is not specifically limited. Therefore, instead of using the duty correction circuit that includes clocked inverters, a duty correction circuit that includes phase interpolators (interpolators) may be used.

Even if the duty correction circuit that includes clocked inverters is used, a specific configuration thereof is not limited to the above-embodiments. For example, in the above embodiments, the control signals P1 to P4 and N1 to N4 are generated based on the values of bits b7 to b2 of the duty detection signal D1, and the control signals IM1 to IM4 are generated based on the values of bits b1 and b0. However, the bits that are used to generate those control signals P1 to P4, N1 to N4 and IM1 to IM4 are not limited to the above bits.

In the above embodiments, the drive capabilities of a plurality of clocked inverters in the duty adjustment units 151 to 154 are weighted by the power of 2. However, this configuration is not necessarily required in the present invention. Therefore, the duty adjustment units can be made by connecting a plurality of clocked inverters having the same drive capability in parallel.

Furthermore, in the above embodiments, there is no difference in drive capability between a plurality of inverter circuits in the synthesis circuit 155. However, those drive capabilities may be weighted by the power of 2.

Moreover, in the above embodiments, the duty ratio of the internal clock signal is increased or decreased in the process of being adjusted to 50%. However, the target duty ratio is not limited to 50%. Furthermore, it is unnecessary to be able to both increase and decrease the duty ratio of the internal clock signal. For example, if it is known beforehand that the duty ratio of the input internal clock signal is smaller than a target value, the function of decreasing the duty ratio is unnecessary, and having the function of increasing the duty ratio is sufficient. In this case, as for the pull-down circuits DN in the duty adjustment units 151 and 153 and the pull-up circuits UP in the duty adjustment units 152 and 154, the drive capabilities are not required to be adjustable. The drive capabilities may be fixed.

What is claimed is:

1. A semiconductor device comprising:
   a duty correction circuit adjusting a duty ratio of a first clock signal based on a duty control signal to generate a second clock signal;
   an adjustable delay line delaying the second clock signal by an adjustable delay to generate a third clock signal, wherein the adjustable delay is based on a phase of the first clock signal and a phase of the third clock signal; and
   a duty cycle detector detecting the duty ratio of the second clock signal to generate the duty control signal indicative of a first mode, and detecting the duty ratio of the third clock signal to provide the duty control signal indicative of a second mode for adjusting the duty ratio of the third clock signal,
   wherein the duty correction circuit adjusting the duty ratio of the third clock signal based on the generated duty control signal indicative of the second mode for adjusting the duty ratio of the third clock signal.

2. The semiconductor device as claimed in claim 1, wherein the duty cycle detector operates in the first mode in response to a reset signal, and then shifts to the second mode.

3. The semiconductor device as claimed in claim 1, wherein
   the duty control signal includes a plurality of control signals,
   the duty correction circuit includes a plurality of clocked inverters that are connected in parallel, and
   the plurality of clocked inverters are independently controlled by the plurality of control signals.

4. The semiconductor device as claimed in claim 3, wherein
   each of the clocked inverters includes an input node, an output node, a pull-up circuit that pulls up the output node based on a level of the input node, and a pull-down circuit that pulls down the output node based on a level of the input node, and
   at least one of the pull-up circuit and the pull-down circuit is selectively activated by a corresponding one of the control signals.

5. A semiconductor device comprising:
   a duty correction circuit adjusting a duty ratio of a first clock signal based on a duty control signal to generate a second clock signal;
   an adjustable delay line delaying the second clock signal by an adjustable delay to generate a third clock signal, wherein the adjustable delay is based on a phase of the first clock signal and a phase of the third clock signal; and a duty cycle detector detecting the duty ratio of the second clock signal to generate the duty control signal in a first mode, and detecting the duty ratio of the third clock signal to generate the duty control signal in a second mode, wherein the duty cycle detector operates in the first mode in response to a reset signal, and then shifts to the second mode, and wherein the duty cycle detector shifts from the first mode to the second mode when the duty ratio of the second clock signal reaches a predetermined value.

6. The semiconductor device as claimed in claim 5, wherein the predetermined value is approximately 50%.

7. A semiconductor device comprising:
a duty correction circuit adjusting a duty ratio of a first clock signal based on a duty control signal to generate a second clock signal;
an adjustable delay line delaying the second clock signal by an adjustable delay to generate a third clock signal, wherein the adjustable delay is based on a phase of the first clock signal and a phase of the third clock signal; and
a duty cycle detector detecting the duty ratio of the second clock signal to generate the duty control signal in a first mode, and detecting the duty ratio of the third clock signal to generate the duty control signal in a second mode, wherein the duty cycle detector updates the duty control signal in a first cycle in the first mode, and updates the duty control signal in a second cycle that is longer than the first cycle in the second mode.

8. A semiconductor device comprising:
a duty correction circuit adjusting a duty ratio of a first clock signal based on a duty control signal to generate a second clock signal;
an adjustable delay line delaying the second clock signal by an adjustable delay to generate a third clock signal, wherein the adjustable delay is based on a phase of the first clock signal and a phase of the third clock signal; and
a duty cycle detector detecting the duty ratio of the second clock signal to generate the duty control signal in a first mode, and detecting the duty ratio of the third clock signal to generate the duty control signal in a second mode, wherein the duty correction circuit adjusts the duty ratio of the first clock signal by a first pitch when the duty cycle detector operates in the first mode, and the duty correction circuit adjusts the duty ratio of the first clock signal by a second pitch smaller than the first pitch when the duty cycle detector operates in the second mode.

9. A semiconductor device comprising:
a duty correction circuit adjusting a duty ratio of a first clock signal based on a duty control signal to generate a second clock signal;
a delay line delaying the second clock signal to generate a third clock signal;
a duty cycle detector detecting the duty ratio of the second clock signal to generate the duty control signal in a first mode, and detecting the duty ratio of the third clock signal to generate the duty control signal in a second mode;
a replica circuit delaying the third clock signal to generate a fourth clock signal;
a phase determination circuit comparing a phase of the first clock signal with a phase of the fourth clock signal to generate a phase determination signal; and
a delay line control circuit updating a count value based on the phase determination signal,
wherein the delay line controls an amount of delay in accordance with the count value.

10. The semiconductor device as claimed in claim 9, further comprising:
an external terminal; and
an output circuit driving the external terminal in synchronization with the third clock signal,
wherein a signal waveform that emerges on the external terminal substantially matches a signal waveform of the fourth clock signal.

11. A semiconductor device comprising:
a duty correction circuit inserted into a propagation path of a clock signal and adjusting a duty ratio of a clock signal based on a first duty control signal; and
a duty cycle detector detecting a duty ratio of the clock signal output from the duty correction circuit to generate the first duty control signal, wherein
in a first mode, the duty cycle detector detects the duty ratio of the clock signal that emerges on a first node of the propagation path so that a feedback loop containing the duty correction circuit and the duty cycle detector has a first loop length,
in a second mode, the duty cycle detector detects the duty ratio of the clock signal that emerges on a second node of the propagation path that is different from the first node so that the feedback loop has a second loop length that is longer than the first loop length, and wherein the duty cycle detector generates a second duty control signal indicative of the second mode for the duty correction circuit to adjust the duty ratio of the clock signal that emerges on the second node; and
a delay line delaying the clock signal, the delay line includes a coarse delay line for coarse adjustment and a fine delay line for fine adjustment and the delay line being inserted between the first and second nodes of the propagation path.

12. A semiconductor device comprising:
a duty correction circuit adjusting a duty ratio of a first clock signal based on a first duty control signal to generate a second clock signal, wherein the duty correction circuit adjusting the duty ratio of the first clock signal based on the first duty control signal indicating that a coarse adjustment circuit adjusts the ratio of the first clock signal in a first mode;
an adjustable delay line delaying the second clock signal by an adjustable delay to generate a third clock signal, wherein the adjustable delay is based on a phase of the first clock signal and a phase of the third clock signal; and
a duty detection unit receiving the second clock signal and the third clock signal, the duty detection unit providing a second duty control signal indicative of the duty correction circuit adjusting the duty ratio of the third clock signal,
wherein the duty correction circuit adjusting the duty ratio of the third clock signal based on the second duty control signal indicating that a fine adjustment circuit adjusts the duty ratio of the third clock signal in a second mode.

13. The semiconductor device as claimed in claim 12, wherein the duty detection unit includes a selection circuit that selects one of the second clock signal and the third clock signal, and a duty cycle detector that detects a duty ratio of selected one of the second and third clock signals selected by the selection circuit.

14. The semiconductor device as claimed in claim 13, wherein the duty cycle detector starts detecting the duty of the second or third clock signal in response to a reset signal.

15. The semiconductor device as claimed in claim 13, wherein the selection circuit selects the third clock signal after selecting the second clock signal.

16. The semiconductor device as claimed in claim 12, further comprising a delay line control circuit comparing a phase of the first clock signal with a phase of the third clock signal to control a delay amount of the delay line.

17. A semiconductor device as claimed in claim 12, wherein the delay line includes a coarse delay line for coarse adjustment and a fine delay line for fine adjustment.

* * * * *